United States Patent [19]

Nelson et al.

[11] Patent Number: 5,053,921
[45] Date of Patent: Oct. 1, 1991

[54] MULTILAYER INTERCONNECT DEVICE AND METHOD OF MANUFACTURE THEREOF

[75] Inventors: Gregory H. Nelson, Gilbert; Steven C. Lockard, Phoenix, both of Ariz.

[73] Assignee: Rogers Corporation, Rogers, Conn.

[21] Appl. No.: 601,927

[22] Filed: Oct. 23, 1990

Related U.S. Application Data

[63] Continuation-in-part of Ser. No. 352,112, May 15, 1989, Pat. No. 4,995,941.

[51] Int. Cl.⁵ .................... H05K 7/20; B44C 1/22; H01L 23/02
[52] U.S. Cl. ..................... 361/386; 357/74; 156/630
[58] Field of Search ............. 357/74, 69, 70; 174/68.5; 219/121 LL; 361/306, 406, 421; 156/630

[56] References Cited

U.S. PATENT DOCUMENTS

| | | | |
|---|---|---|---|
| 4,498,122 | 2/1985 | Rainal | 361/414 |
| 4,744,007 | 5/1988 | Watari et al. | 361/386 |
| 4,922,325 | 5/1990 | Smeltz | 357/74 |
| 4,972,253 | 11/1990 | Palino et al. | 357/74 |
| 4,991,001 | 2/1991 | Takubo et al. | 357/80 |

*Primary Examiner*—Donald A. Griffin
*Attorney, Agent, or Firm*—Fishman, Dionne & Cantor

[57] ABSTRACT

An interconnect device for electronic components, such as integrated circuits, multichip modules and the like, and the method of manufacture thereof are presented. The interconnect device has at least three layers of circuitry, one for signal transmission and two for voltage planes (power and ground). The interconnect device is made by a processing on a stainless steel carrier plate to achieve high lead count capability with fine line widths and spacing, as well as precise registration layer to layer. Laser drilling is used to define interconnect vias between signal and voltage (power and ground) plane layers.

40 Claims, 33 Drawing Sheets

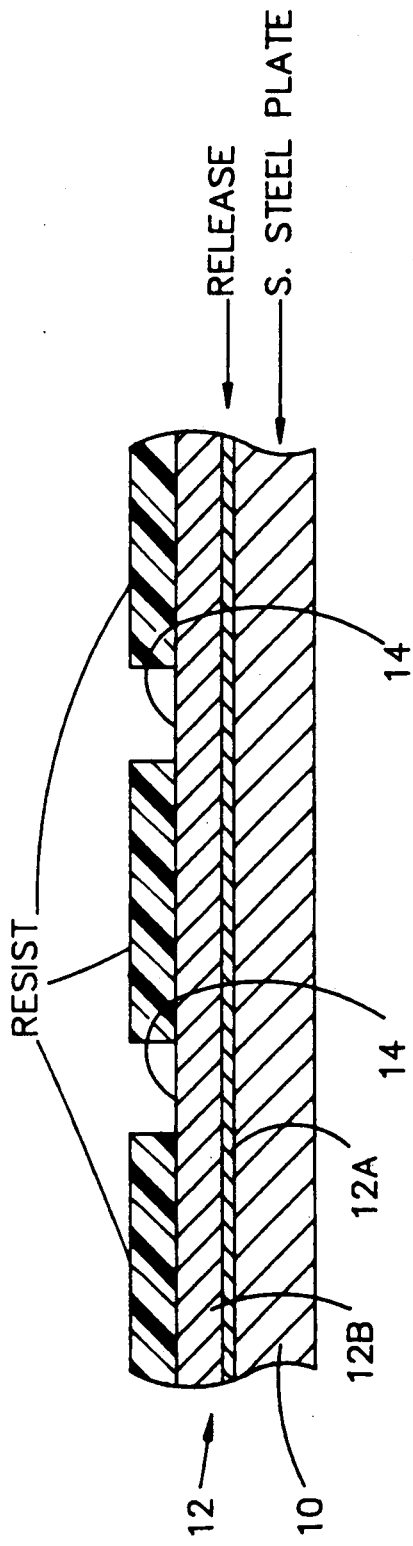
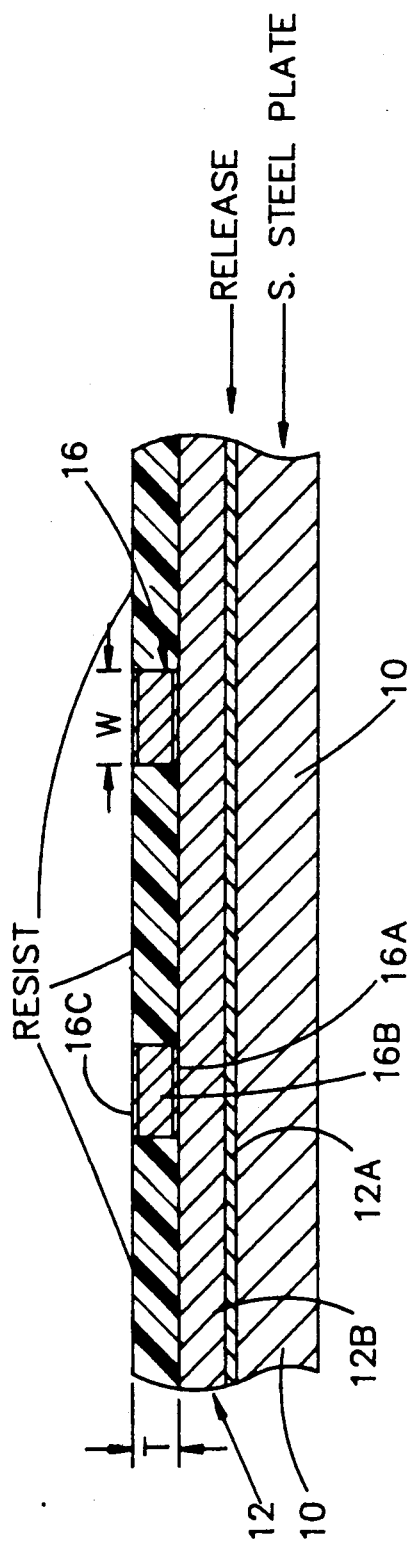

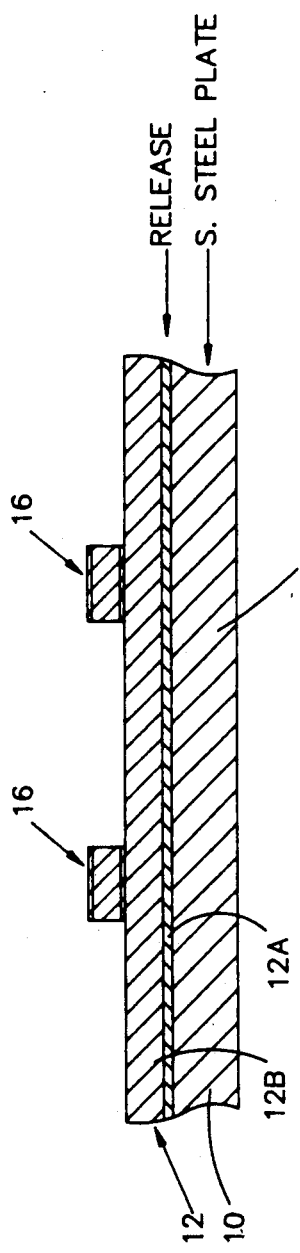
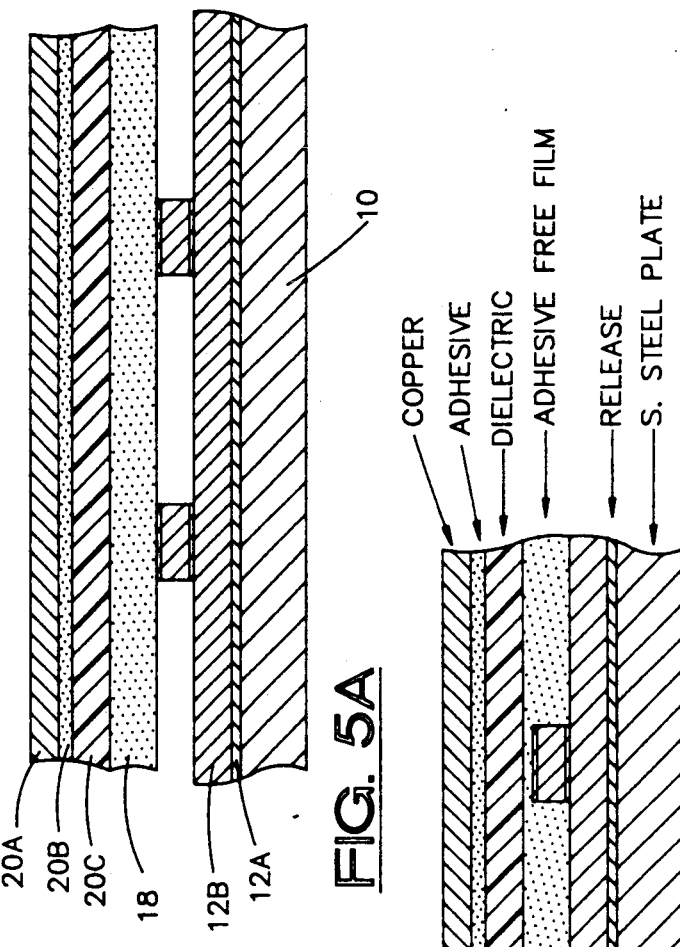
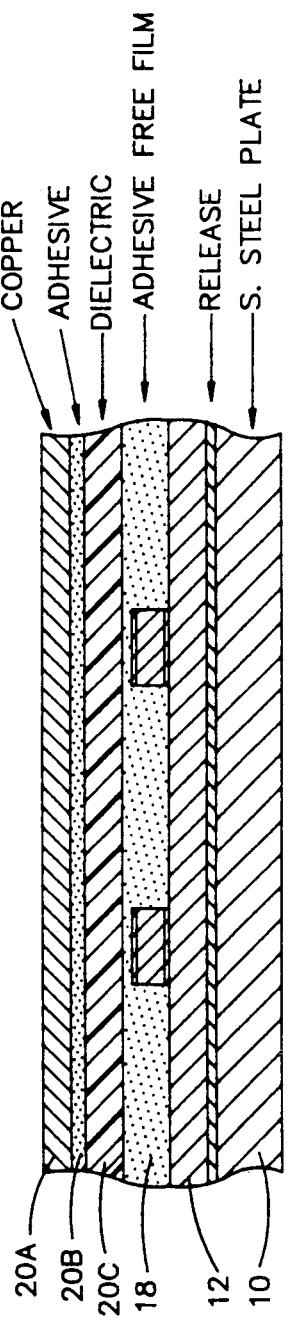

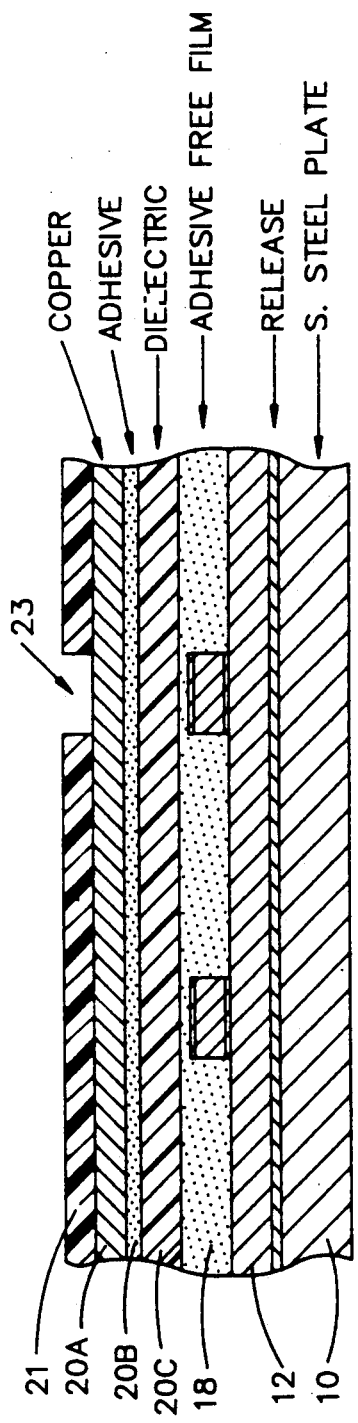
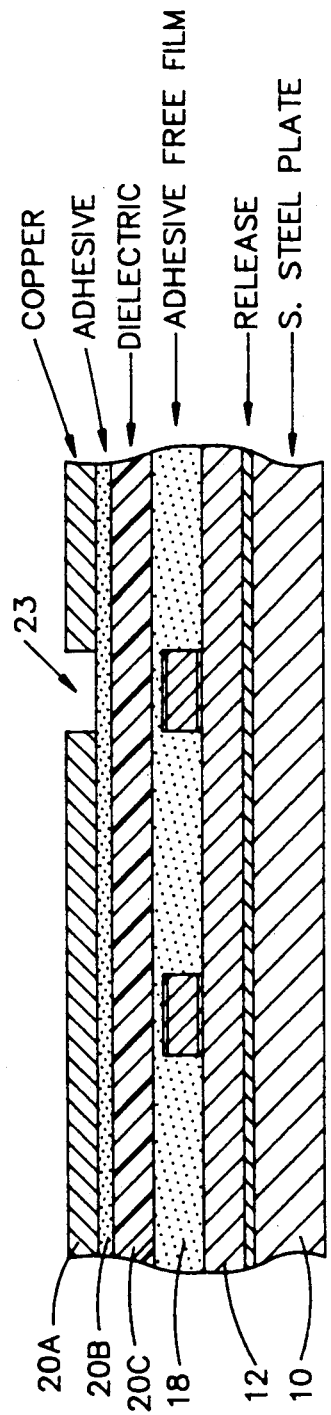
FIG. 7(1)
FIG. 7(2)

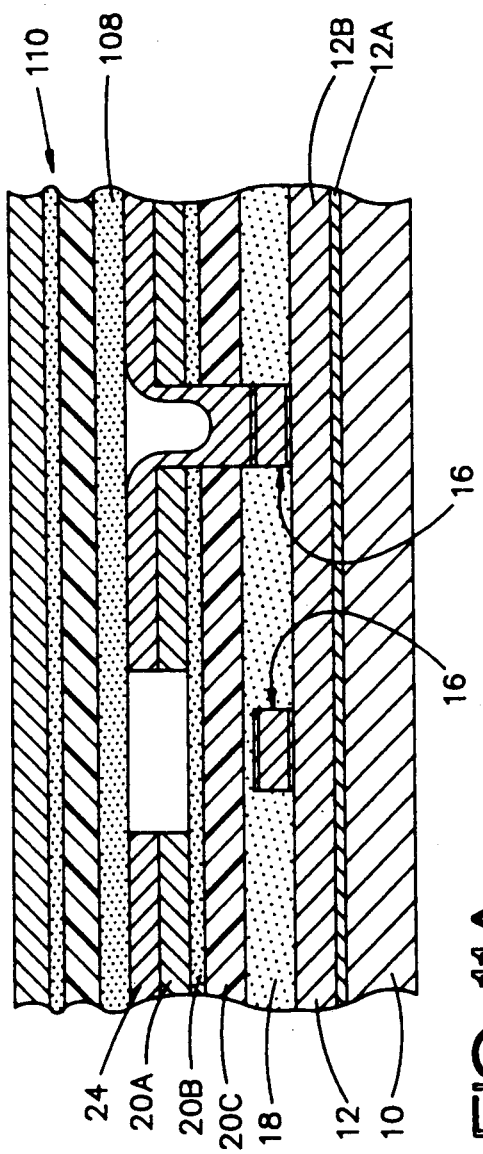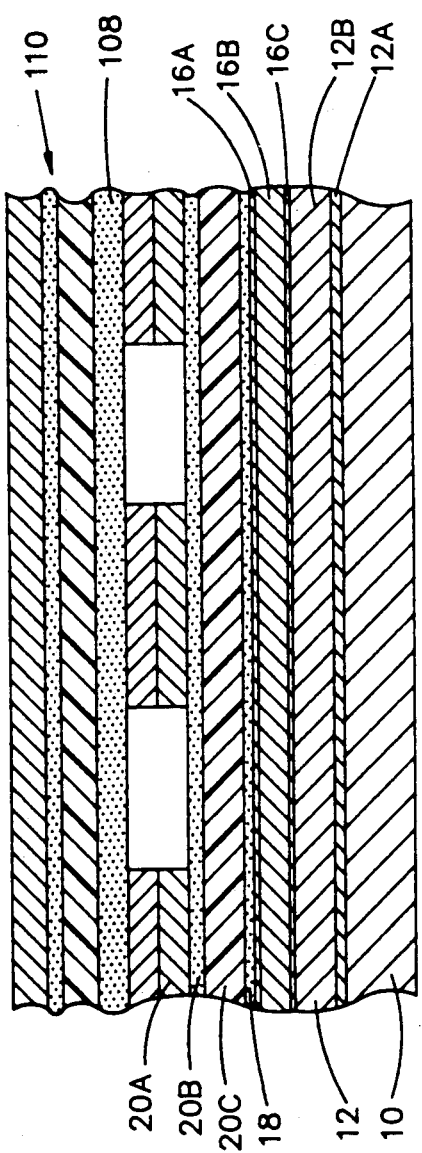

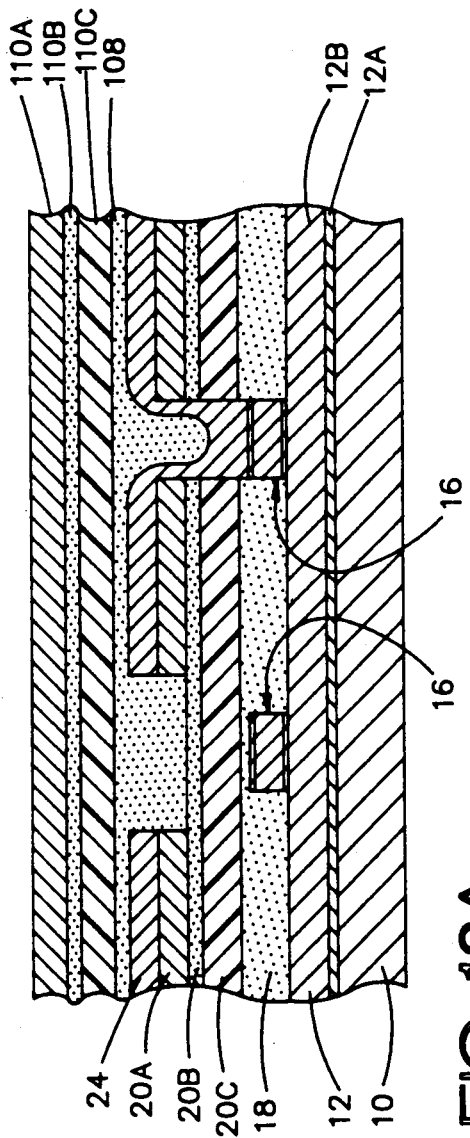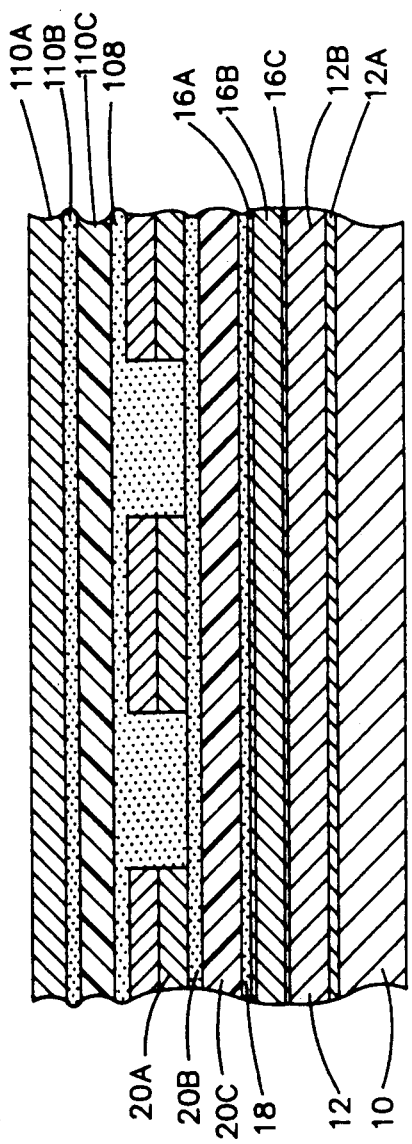

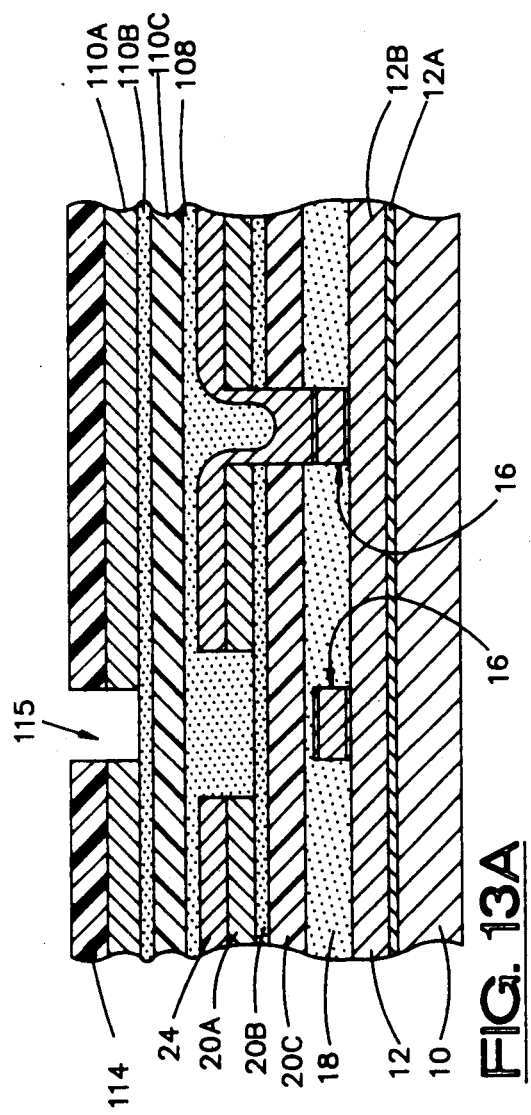
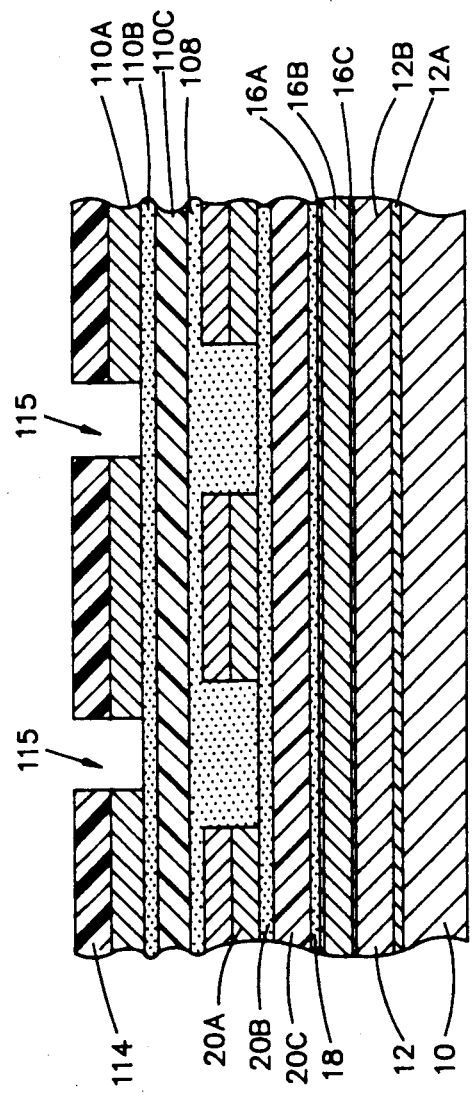
FIG. 13A
FIG. 13B

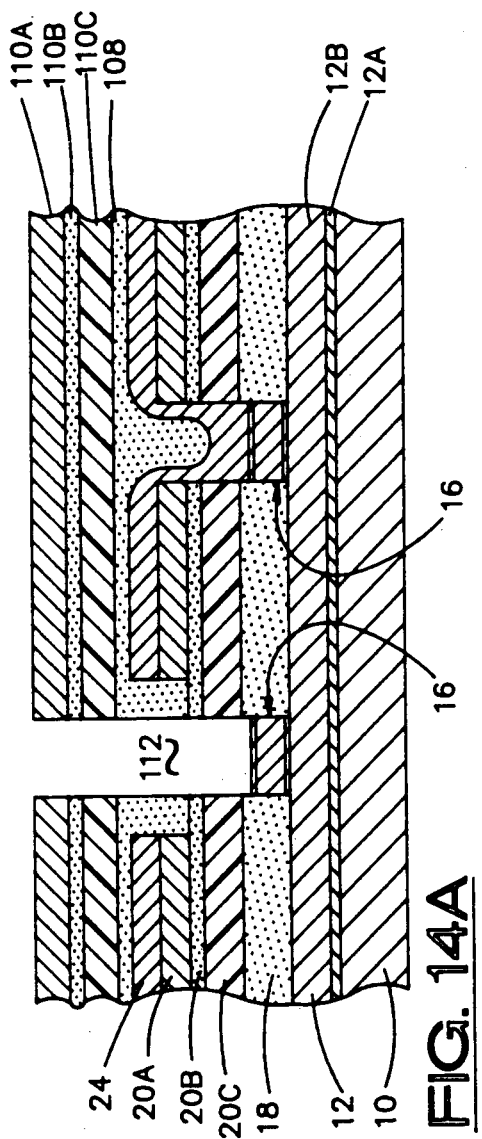
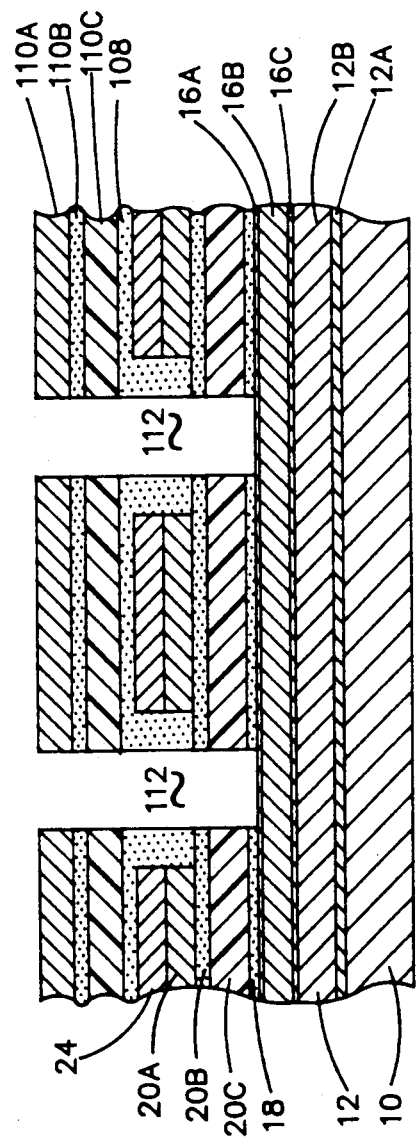

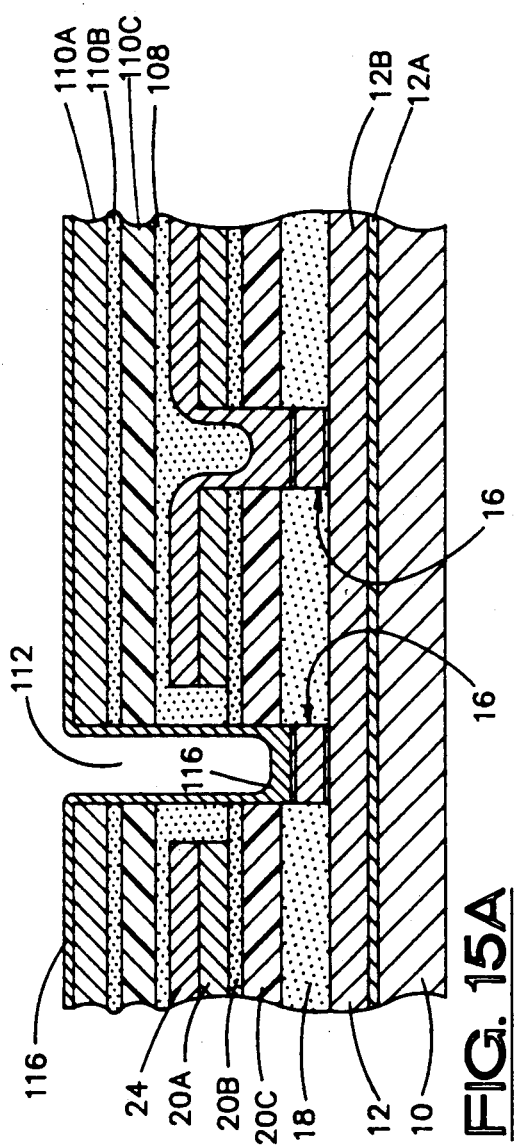
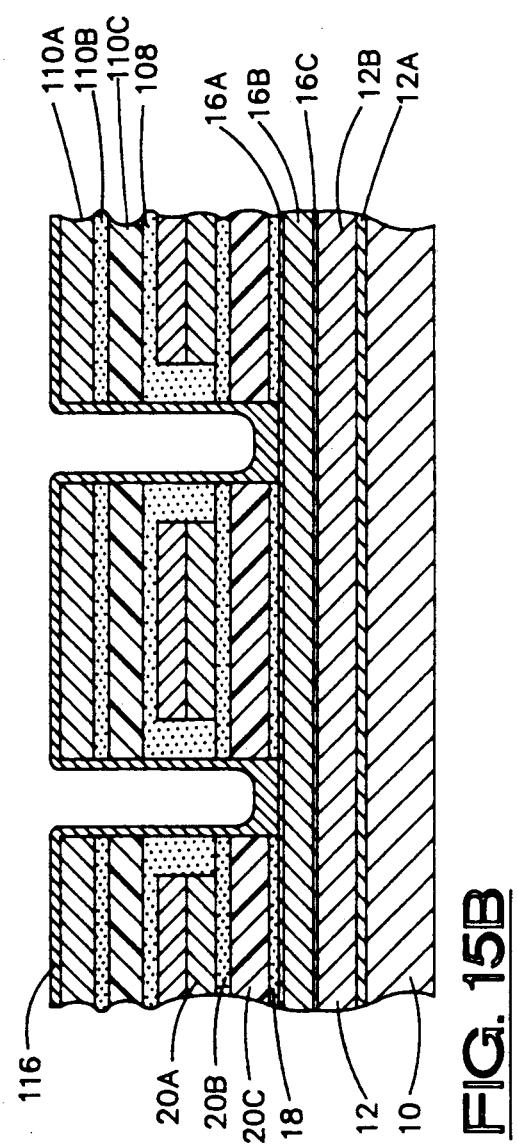
FIG. 15A
FIG. 15B

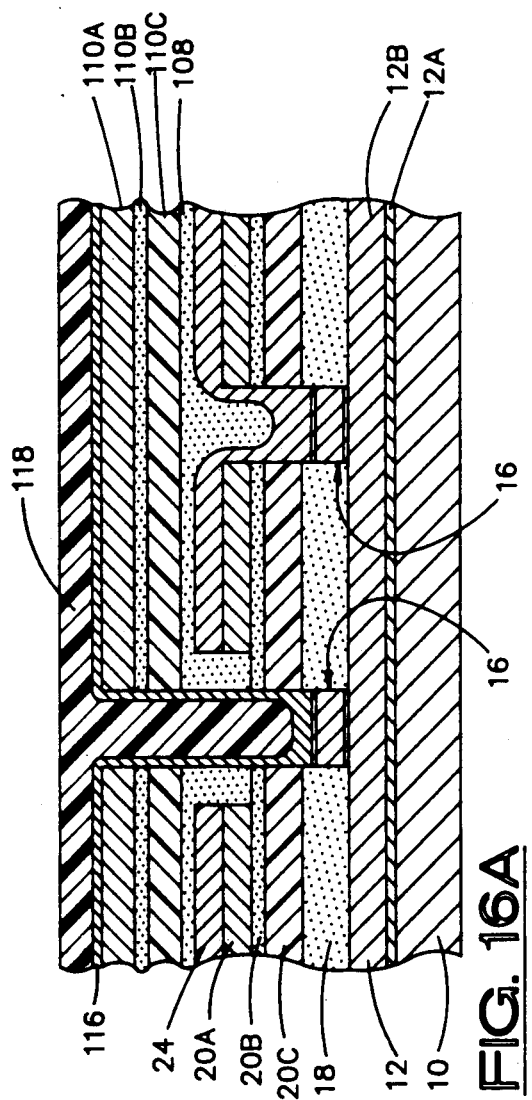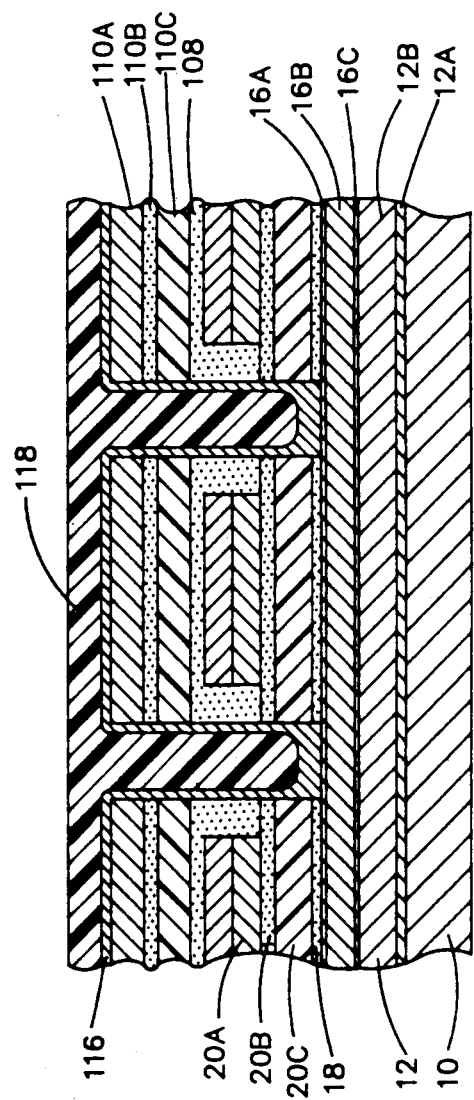

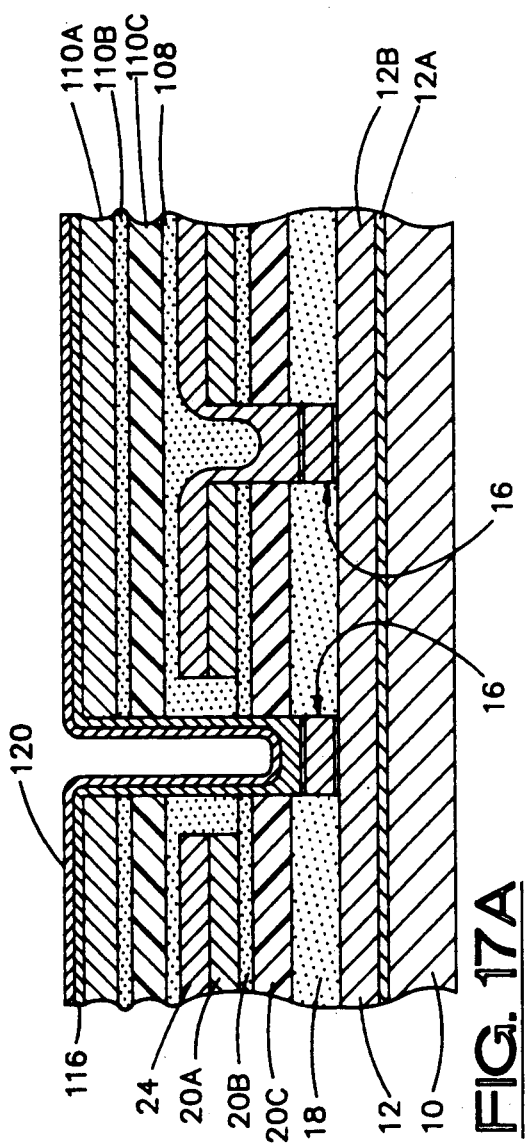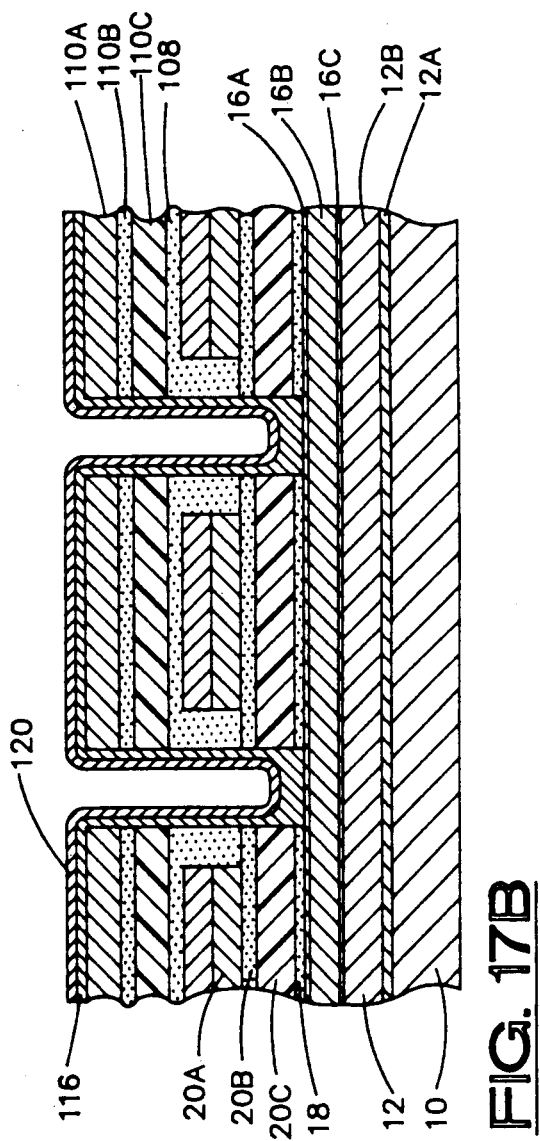

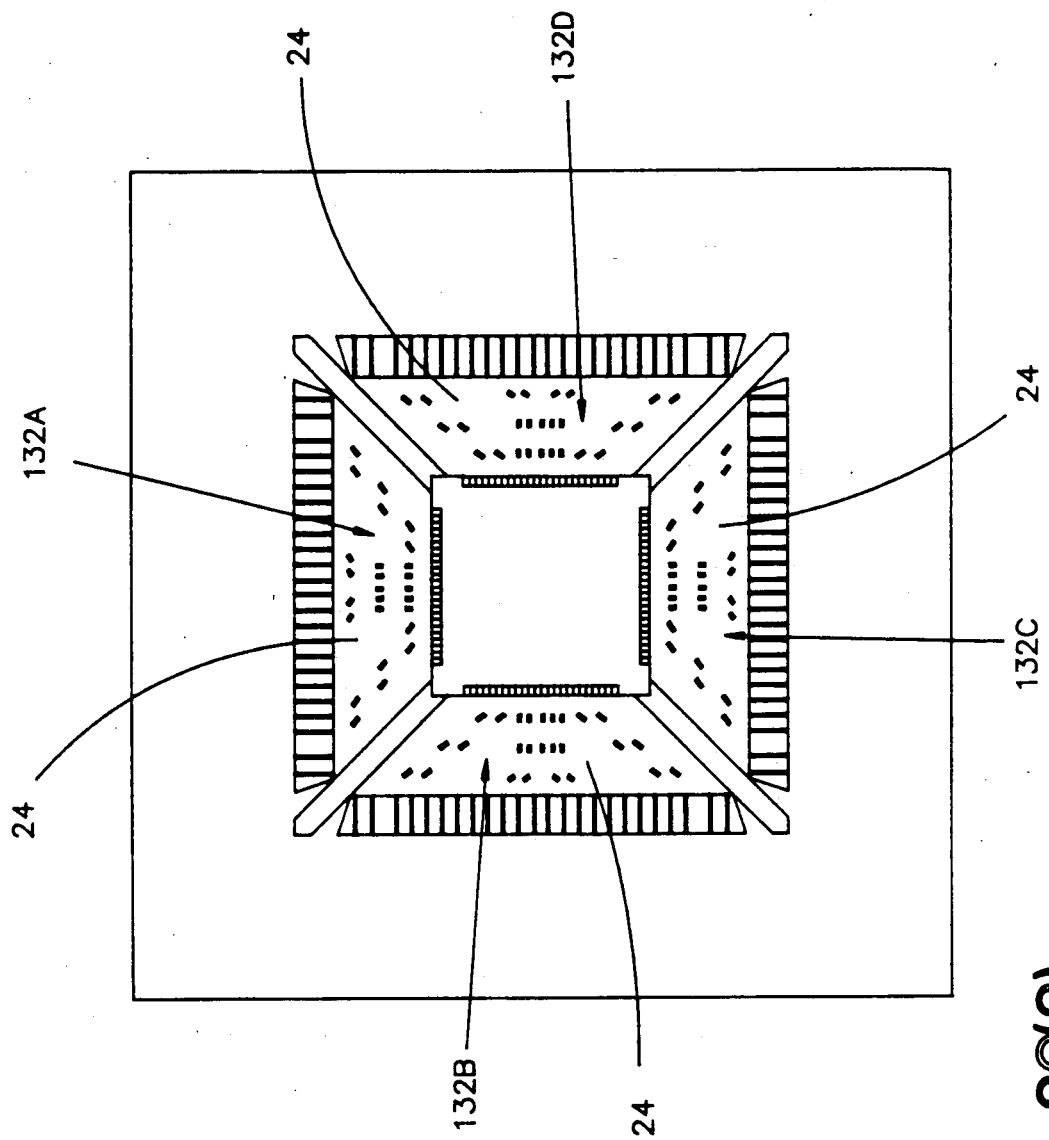

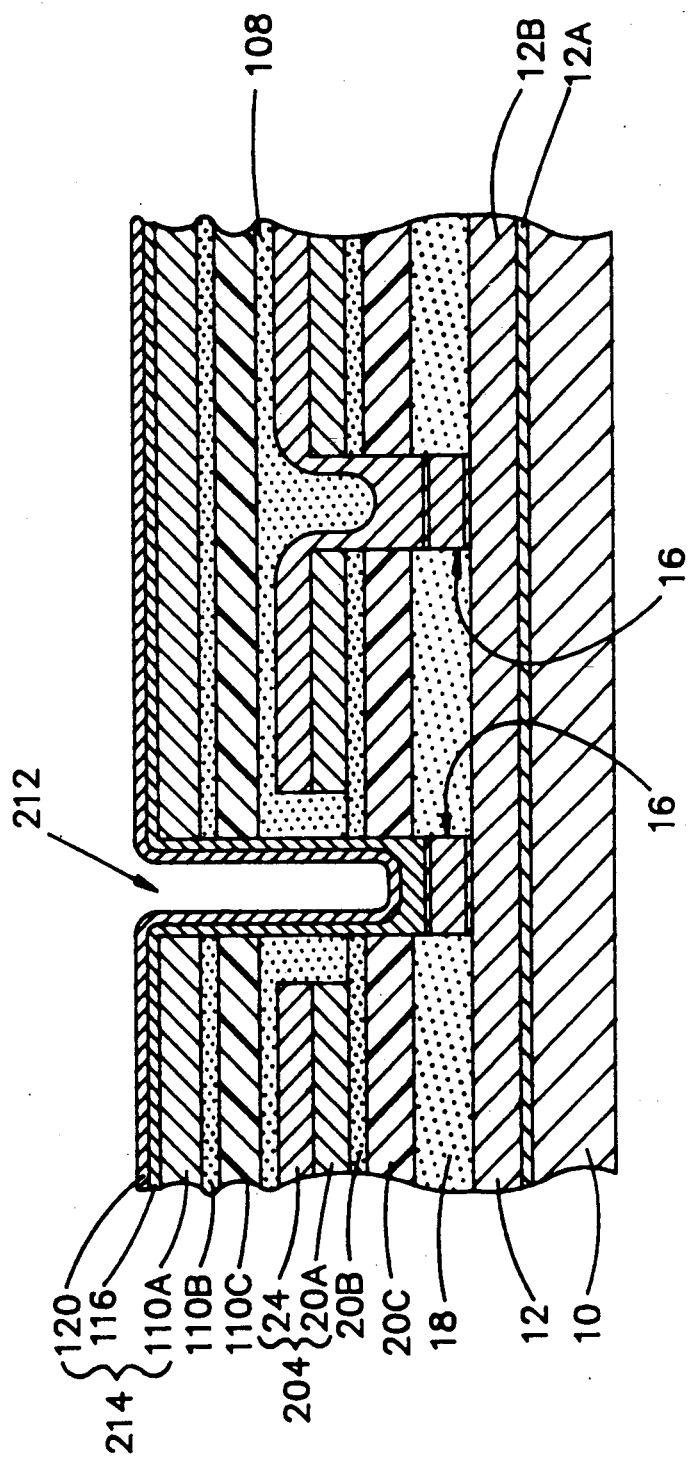

FIG. 25

A  FORM RELEASE MOLD LAYER ON BACKER PLATE

B  PHOTORESIST PATTERNING

C  PLATE LEAD LINES & REGISTRATION FEATURES

D  REMOVE RESIST

E  POSITION LAMINATE

F  BOND LAMINATE

G  FORM FIRST VIA HOLES

H  CONNECT LINES TO GROUND PLANE ⟶ I  PATTERN SECOND VIAS & WINDOWS

P  FORM WINDOWS & FRAMES

Q  INTRODUCE PROTECTOR MATERIAL

R  REMOVE SUPPORT PLATE & RELEASE LAYER

J  ETCH TO FORM OVERSIZED SITES

K  POSITION LAMINATE

L  BOND LAMINATE

M  FORM SECOND VIA HOLES

N  CONNECT LINES TO POWER PLANE

O  ETCH WINDOW SITES & PLATE

MULTILAYER INTERCONNECT DEVICE AND METHOD OF MANUFACTURE THEREOF

BACKGROUND OF THE INVENTION

In recent years there has been an increased requirement for high lead count interconnect devices, especially for high density electrical components such as integrated circuits, multichip modules, etc. In recent years the packaging of integrated circuits (ICs) has evolved from conventional devices such as the dual in-line package (DIP) to a variety of devices such as surface mounted ICs. This evolution has led to the need for interconnect devices to connect the ICs to other circuitry. Various devices have been proposed and used to effect such interconnection, such as wire bonding and tape automated bonding (TAB) products.

As this field of technology has developed, the requirements for the number of leads to connect the IC to external circuitry have increased. That is, there are growing requirements for interconnect devices that are sometimes referred to as high lead count devices. There is a need in the art for high lead count in the range of 300 or more. As the lead count increases, the requirements for the interconnect device become more difficult. For a given size IC device, higher lead counts mean that the interconnect device must have finer lead widths, finer spacing between leads and better control of line width. There is a need in the art for three or even two mil pitch, i.e. 1 ½ or 1 mil line width and 1 ½ or 1 mil spacing, respectively. The prior art is not capable of producing commercially attainable product having such lead count and pitch. Also, since the inner leads of the device (i.e., the leads to be connected to the IC device) are supported in a cantilever manner prior to connection to the IC device, a high lead count imposes increased requirements for maintaining the center to center spacing between the leads, maintaining registration with the desired points of contact on the IC and maintaining lead planarity. Many high lead count ICs have requirements for interconnect devices with impedance control to reduce mismatched impedance of signal lines. In addition, with fine pitch of leads, signal crosstalk also becomes a problem. Similarly, there are requirements for high lead count interconnection devices for other electronic components, such as high density multichip modules, to interconnect the electronic components to other circuit components such as a printed circuit board. Such high lead count interconnect devices may have problems and requirements similar to those discussed above.

There is also a recognized need in such interconnect devices to have power and ground planes whereby power and ground voltages can be connected to various signal leads as desired. My prior application Ser. No. 352,112 discloses a two layer interconnect device having signal leads in one layer and a voltage plane (which is either a ground or power plane) in another layer. The ground or power layer is connected to selected leads in the lead layer by vias to supply either ground or power voltage to selected leads in the lead layer. It has been recognized that it would be highly desireable to have an interconnect device with three conductive layers (a lead layer and two voltage planes) so that both power and ground could be connected to selected leads in the lead layer. However, while the need for such a three conductive layer interconnect device has been recognized, that device has not heretofore been available because it has not been known how to make the device.

SUMMARY OF THE INVENTION

The present invention will be described primarily in the context of an interconnect device for an IC, the interconnect sometimes being referred to in the art as a high lead count tape automated bonding (TAB) circuit. However, it will be understood that the invention has more general utility, particularly in the manufacture of high lead count interconnect devices for high density electronic components in general.

The present invention addresses the problems discussed above in a new and improved interconnect device and method of manufacture thereof. While the present invention is particularly suitable for and intended to be a high lead count device (e.g., in the range of 300 or more leads), and will be described in that context, it should also be understood that the features and advantages of both the process and the end product of the present invention can also be employed in similar interconnect devices that do not have high lead count requirements and also in other interconnect devices in general.

The interconnect device of the present invention has fine signal lead widths, fine spacing between leads, and close control of lead width. The center-to-center spacing of the cantilevered inner ends of the leads is maintained to within very tight tolerances, as is registration with the intended points of contact with the IC.

In addition to the signal lead layer, the interconnect device of the present invention also incorporates at least two other conductive layers or voltage planes, one being a ground plane and the other being a power plane. Ground or power voltages can be delivered to the ground and power layers either directly or by via connectors from the lead layer to the ground and power planes; and the ground and power planes are connected to selected leads in the signal lead layer by vias formed in the multilayer device to supply ground and power voltages to selected ones of the leads to the IC or the outside circuitry to which the IC is connected. The presence of both power and ground planes in close proximity to each other provides low power supply inductance which results in reduced switching noise, particularly when the device is used with advanced integrated circuits. The presence of both ground and power planes in the device which are connected by vias to leads in the lead layer also results in a device having improved and more versatile signal, ground and power distribution capabilities. The accuracy of line width control and line spacing and the presence of a voltage layer closely adjacent to the signal layer result in a device with improved impedance control characteristics and reduced signal crosstalk. The technology of the present invention has sufficient resolution to permit signal line densities as fine as 1 mil line widths on 2 mil centers. The completed device of the present invention is also a self supporting interconnect structure.

A modified embodiment of the present invention also provides for the incorporation of a decoupling capacitor between the ground voltage plane and the power voltage plane to incorporate high capacitance with a minimum of added inductance, thereby reducing switching noise.

The above described and other features and advantages of the present invention will be understood by those of ordinary skill in the art from the following detailed description and drawings.

BRIEF DESCRIPTION OF THE DRAWINGS

Referring to the drawings, wherein like elements are numbered alike in the several FIGURES:

FIGS. 3-8, 9A through 17A are partial sectional elevation views as if taken along line A-A of FIG. 2 but showing the status of the device at different stages of manufacture.

FIGS. 9B through 17B are partial sectional elevation views taken along line B—B of FIGS. 2 showing the status of the device at the different stages of manufacture shown in FIGS. 9A-17A.

FIGS. 9C through 17C are partial sectional elevation views taken along line C—C of FIG. 2, but showing the status of the device at the different stages of manufacture shown in FIGS. 9A-17A and 9B-17B.

FIG. 24 is a partial sectional elevation view taken along line 20—20 of FIG. 23.

FIG. 25 is a block diagram of the manufacturing process of the present invention.

DESCRIPTION OF THE PREFERRED EMBODIMENT

Figure 1:
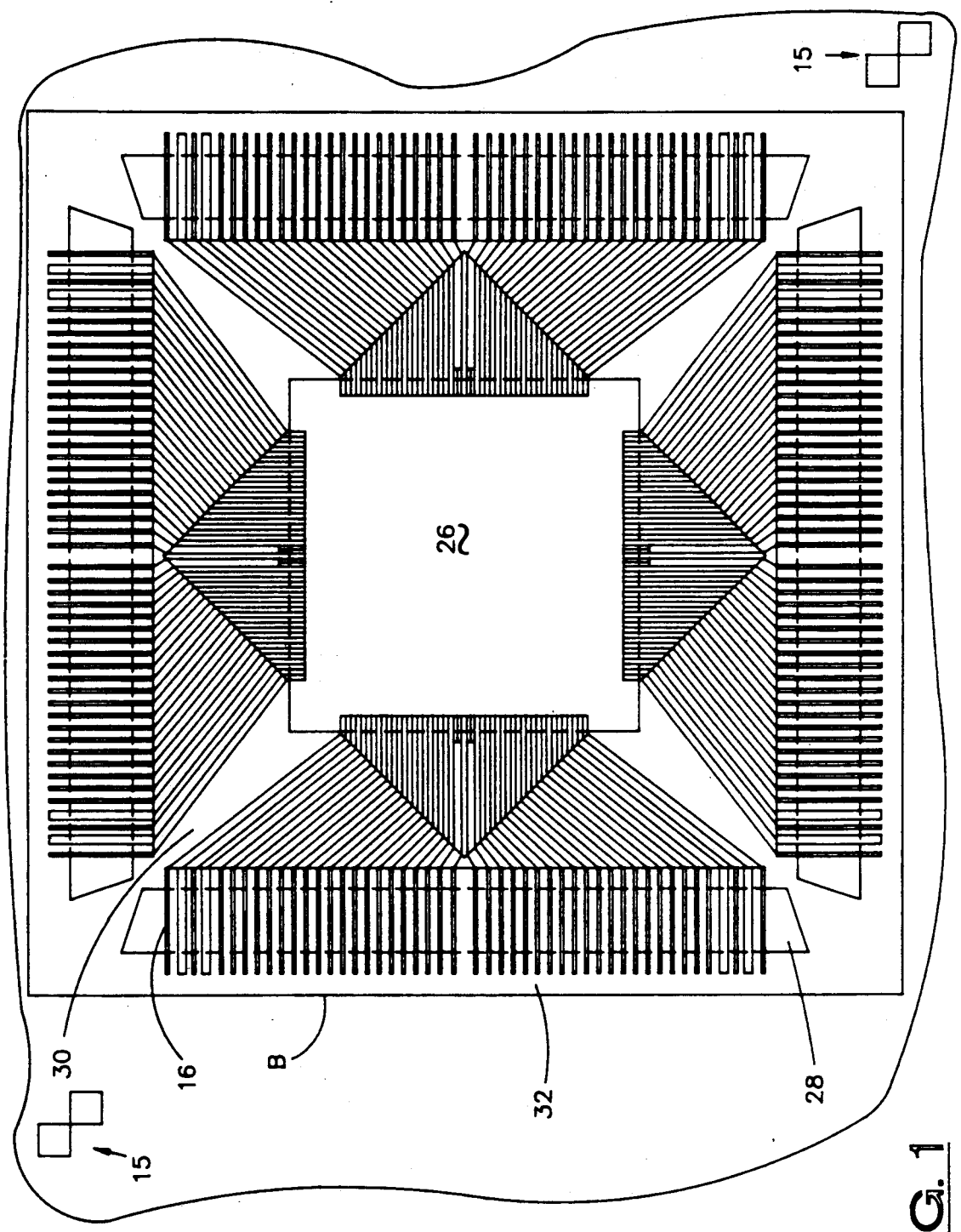
FIG. 1 is a plan view of an interconnect device in accordance with the present invention viewed from the bottom in the manufacturing process (also the bottom when positioned for use).

The interconnect device of the present invention and its method of manufacture are illustrated in the drawings. To facilitate an understanding of the invention, both the device and its method of manufacture will be described in a combined consideration of FIGS. 1-25.

Figure 2:
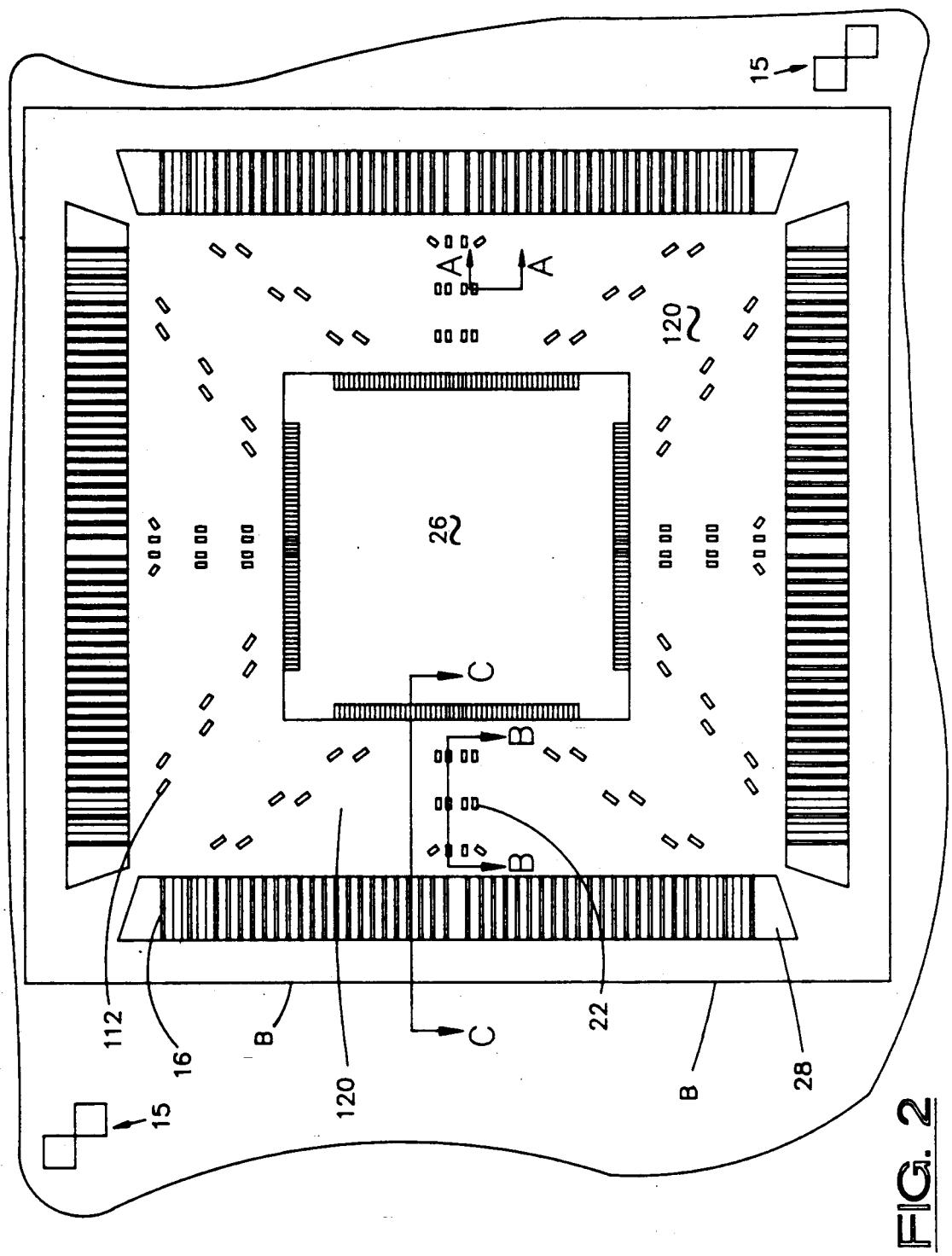
FIG. 2 is a plan view of the device of FIG. 1 rotated 180° to reverse the top and bottom surfaces.

For purposes of explanation and illustration, the invention will be described in connection with an interconnect device of the tape automated bonding type (TAB) as shown in FIGS. 1 and 2; but it will be understood that the invention is useful in other interconnect devices. As is conventional in the art, the TAB device has a plurality of leads (item 16 in FIGS. 1 and 2) distributed around the four sides of the TAB device. These leads extend from outer lead bond ends toward the center of the device, and they converge to fit into the space available at the inner lead bond ends. Because of this convergence, the leads at the outer lead bond ends are spaced further apart than at the inner lead bond ends, and the leads may be closely crowded together at the inner lead bond ends. It will be understood that the TAB device shown in FIGS. 1 and 2 is for purposes of illustration only. No attempt has been made to show actual arrays or sizing of lead lines.

In the process of the present invention, the TAB circuit is made in a manufacturing process by which a plurality of TAB circuits are formed simultaneously in a sheet on a backer or support structure. The individual TAB circuits are singulated by excising from the sheet at the end of the manufacturing process. FIGS. 1 and 2 show one such device of a plurality formed in the manufacturing, the irregular line around the device signifying that it is one unit on a sheet of a plurality of such units.

This invention involves both the multilayer interconnect device and its method of manufacture. To promote a better understanding of the invention, the process of manufacture will be explained first, and the construction of the product will be disclosed as the process is explained.

Referring first to FIGS. 3 and 4, a stainless steel carrier or base plate 10 and a release layer 12 form the support structure on which a plurality of interconnect devices are formed in the manufacturing process. Base plate 10 can be of other metallic or nonmetallic materials, the requirement being that it be flat, dimensionally stable, and have a highly polished conductive surface. While, as mentioned above, a plurality of interconnect devices are formed on carrier plate 10, only one such device is shown and described in this explanation of the manufacturing process. It will, however, be understood that a plurality of such interconnect devices are all formed at the same time on the surface of plate 10, with the process steps described herein being performed simultaneously for each interconnect device. Plate 10 is of sufficient thickness to form a rigid and secure carrier for the manufacturing process to assist in precise line control, as will be discussed hereinafter. Release layer 12 consists of a thin layer 12A of nickel electroplated to plate 10 and a thicker layer 12B of copper electroplated on top of the nickel layer. Since neither the nickel nor the copper are strongly adherent to the stainless steel plate (thus constituting a release layer relative to the stainless steel plate), the layers of nickel and copper are formed to extend over the entire surface of plate 10 (only a portion of which is shown in the drawings) and to wrap around the sides of plate 10 and to extend at least a short distance along the back (i.e., bottom) surface. This serves to lock the release layer to the stainless steel plate to give dimensional stability to the stainless steel plate/release layer structure for the manufacturing process, while permitting easy release of stainless steel plate 10 from release layer 12 when it is desired to do so near the end of the manufacturing process. Release layer 12 is about 1 mil. (0.001") thick. The step of forming release layer 12 on stainless steel plate 10 is indicated at step A in FIG. 25. The nickel/copper release layer concept is disclosed in U.S. Pat. Nos. 4,159,222 and 4,306,925. Prior to plating the nickel on the stainless steel plate, the plate is highly polished and inspected for flatness, and the surface is chemically cleaned and activated with an alkaline electrocleaning treatment to remove any oxide buildup. This processing of the plate 10, coupled with the wrap feature, produces the desired release layer which will be adherent during the process and releasable at the end of the process.

For the next step in the manufacturing process, a standard photoresist process is employed to define lines on the upper surface of release layer 12 on which copper leads 16 are to be formed. That is, a resist material is deposited on the upper surface of release layer 12, and the resist layer is then photoexposed through suitable artwork to define a pattern of areas (i.e., over the surfaces 14 on layer 12B) where unexposed resist is washed away, and the rest of the upper surface of layer 12 remains covered with photoresist. As a final step in this photoresist patterning, a plasma etch cleaning step is performed to clean out the areas where the photoresist has been washed away to obtain sharp, clean, fine leads. The photoresist, with portions removed to define the surfaces 14 is shown in FIG. 3. This photoresist patterning step is indicated at step B in FIG. 25.

Signal leads 16 are then formed by electroplating on the surfaces 14. A three step electrodeposition process is used whereby each lead 16 is formed first by electroplating a thin layer 16A of gold on surface 14, then electroplating a main layer of copper 16B and then electroplating another thin layer 16C of gold. Preferably, the layers 16A and 16C may be subdivided into layers of gold and nickel, with the nickel being sandwiched between the gold and copper 16B and acting as a barrier layer. Other electroplatable metals such as tin or nickel, may also be used instead of the gold layers 16A, 16C. The total thickness "T" of each lead 16 may be about 0.001"; and the width "W" of each lead and the spacing therebetween may be as fine as 1 to 2 mils (0.001"-0.002"). It will be understood that FIG. 4 is a partial view and that only two of the signal leads 16 are shown in FIG. 4 for purposes of illustration. The entire device may have in the range of 300 or more leads. Thus, for a single device, such as shown in FIGS. 1 and 2, having 80 leads per side, there would be a total of 320 leads 16. The step of pattern plating leads 16 is indicated at step C in FIG. 25. The remaining resist material on the surface of release layer 12B is then removed to leave exposed leads on the upper surface of layer 12B. The resist removal step is indicated at step D in FIG. 25. FIG. 4 shows the electroplated leads 16 with the resist still in place, and FIG. 5 shows the manufacturing stage where the resist has been removed.

As an integral part of the photoresist patterning of step B and the plating of step C, a plurality of registration features 15 (see FIGS. 1 and 2) are also located and formed on release layer 12 to serve as markers for accurate location of via holes in a later stage of the manufacturing process. A number of such registration features 15 are formed on release layer 12 over the expanse of plate 10, to serve as registration markers for all of the interconnect devices formed at the same time in the manufacturing process, but only two are shown in FIGS. 1 and 2.

Next, a single clad laminate 20 of copper 20A bonded by an adhesive 20B to an insulating substrate 20C is placed on top of leads 16. The laminate 20 includes an exterior layer of adhesive 18. The adhesive 18 is activated by heat and pressure; it may be, e.g., a phenolic butaryl epoxy known as 8970 available from Rogers Corporation, the assignee hereof. Initially the laminate 20 with adhesive 18 is supported on top of the leads 16 (as shown in FIG. 5A) and does not surround the leads as shown in FIG. 6. This step of positioning the laminate is indicated at step E in FIG. 25. Heat and pressure are then applied to bond the laminate 20 to the leads 16 and to release layer 12 as shown in FIG. 6. Laminate 20 may, e.g., be a layer of ½ oz. copper 20A bonded by a layer of adhesive 20B (e.g., 8970 identified above) to a layer of laser etchable polyimide 20C to which the adhesive 18 is adhered. Other laser etchable dielectrics such as fluoropolymer composites, fluoroimides, polyamideimides, etc. and adhesives may be used instead of the described insulation system. Alternatively, an adhesiveless laminate could be used where adhesive 20B is eliminated and copper 20A is bonded directly to insulating substrate 20C. It is important to position the laminate 20 so that the copper layer 20A faces away from leads 16. The application of heat and pressure causes the adhesive layer 18 to flow around and between the leads 16 as shown in FIG. 6. The step of bonding the laminate 20 is indicated at step F in FIG. 25. Laminate 20 (including adhesive layer 18) is prepunched with holes to align with the registration features 15 to leave the registration features visible from the top of the assembly for accurate location of the vias in a subsequent step in the manufacturing process.

Figure 7:
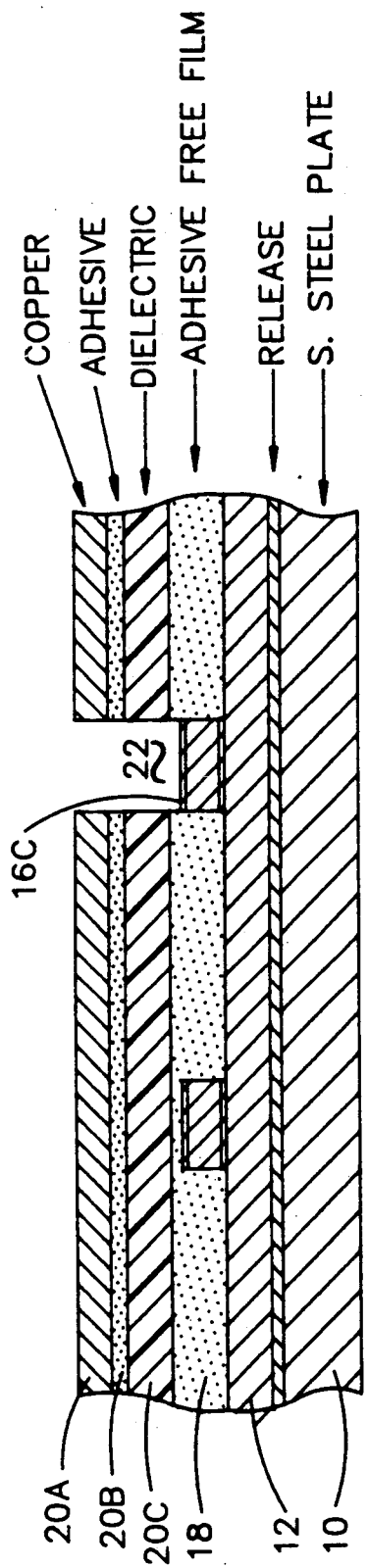

After laminate 20 has been bonded to the assembly, a first set of via holes 22 are formed in the assembly to permit electrical contact to be made with leads 16. FIGS. 7(1), 7(2) and 7(3) show the sequence of formation of this first set of via holes. The formation of only one via hole of this first set is shown in FIGS. 7(1)–(3), but it will be understood that as many of the first set of via holes as desired can be formed. Preferably, at least two vias of the first set will be formed to connect to each lead 16 which will serve as a ground lead in the final assembly of the interconnect device to an IC or other electronic component.

To form the first set of vias, a layer of photoresist 21 is applied to copper layer 20A, and the photoresist is photographically exposed and developed to remove the photoresist only at sites 23 where the first series of vias are to be formed (see FIG. 7(1)). The location of the sites 23 where the photoresist is to be removed is accurately determined by reference to previously formed registration features 15. Bearing in mind the fine line (0.002" width or less) of the leads 16 and the fine spacing (0.002" or less), it will be appreciated that the via holes must be accurately located, and the presence of the registration features 15 makes it possible to do so. After the photoresist has been removed at the locations of the vias, the copper in layer 20A at the via locations is removed by etching to expose adhesive layer 20B. The remaining photoresist is then stripped to expose all of the remaining copper surface 20A (see FIG. 7(2)). The adhesive layer 20B, the dielectric layer 20C and the adhesive layer 18 in the via path are then all removed by a suitable laser beam (such as a $CO_2$ or UV laser) acting as a drill. The exposed copper layer 20A constitutes a mask for the laser drill. The laser scans the surface 20A with no effect except in those locations where the copper in layer 20A has been etched away to expose adhesive layer 20B. At those locations, the laser beam drills (ablates) through the dielectric materials of layers 20B, 20C and 18 to form the via holes 22 and expose the plated surface 16C of lead 16 (see FIG. 7(3)). The via holes 22 are then cleaned by any standard technique (e.g., plasma cleaning, vapor honing, etc.) to define sharp and clean walls in the via holes and a clean exposed surface at layer 16C. The step of forming the via holes is indicated at step G in FIG. 25 and is shown in FIGS. 7(1), 7(2) and 7(3).

Figure 8:
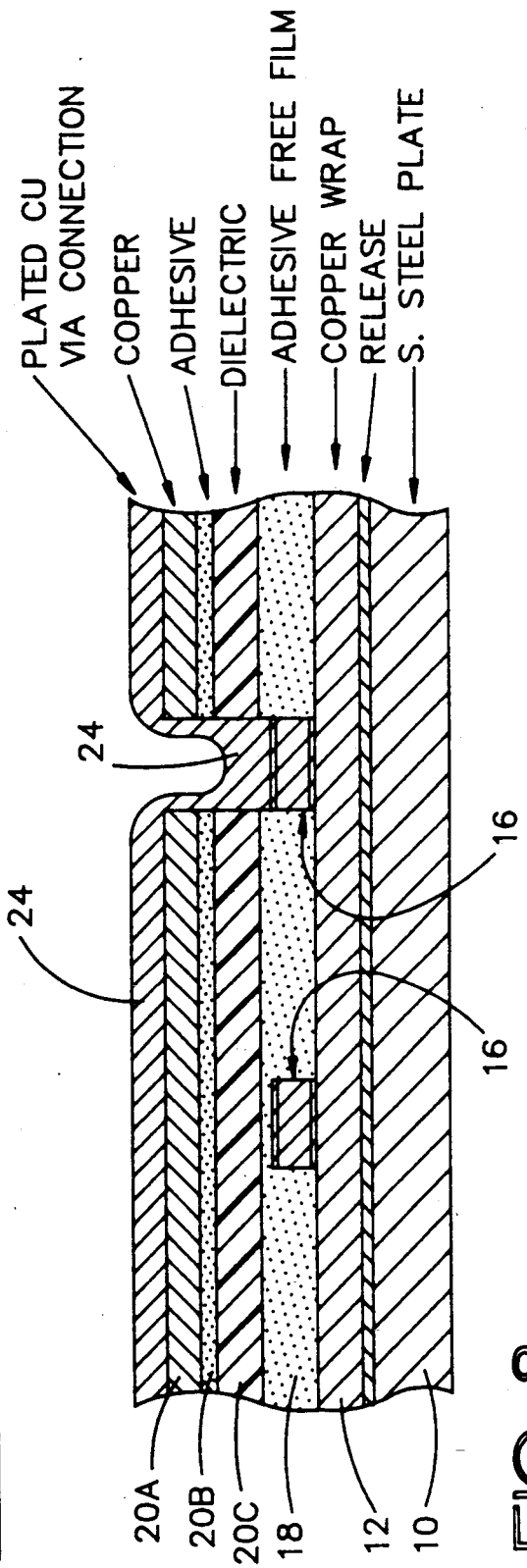

Referring to FIG. 8, copper 24 is then plated to lead 16, along the walls of via holes 22 and to the exposed surface of copper layer 20C to complete the via and form an electrical connection from lead 16 to copper layer 20A which serves as a ground plane in the final product. Copper layer 24 is formed in a two step process where first a very thin layer of copper is formed by electroless deposition or by a vacuum deposition method such as sputtering, and then the remainder of layer 24 is formed by electroplating. The total thickness of layer 24 is about ½ mil (0.00005"). The formation of layer 24 to connect the leads to the power or ground plane is indicated at step H in FIG. 25.

Up to this point the process is the same as described for the two layer interconnect device of application Ser. No. 352,112, and one would proceed to steps P, Q and R if the two layer device of that application were to be formed. However, in this invention the process now varies to form the three (or more) layer device of this invention.

Figure 9A:
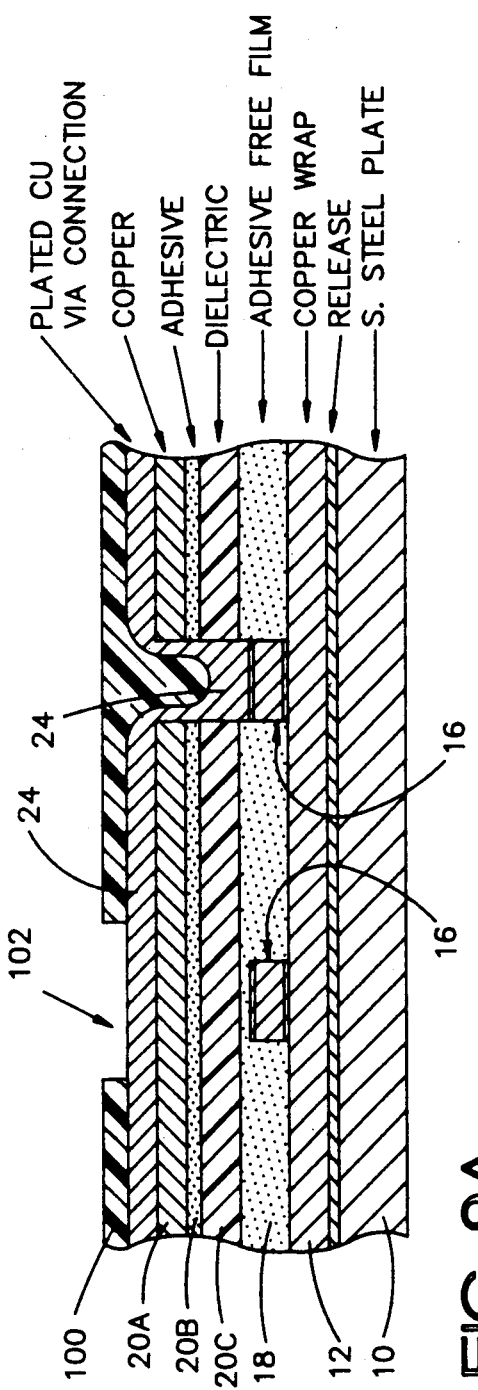
Figure 9B:
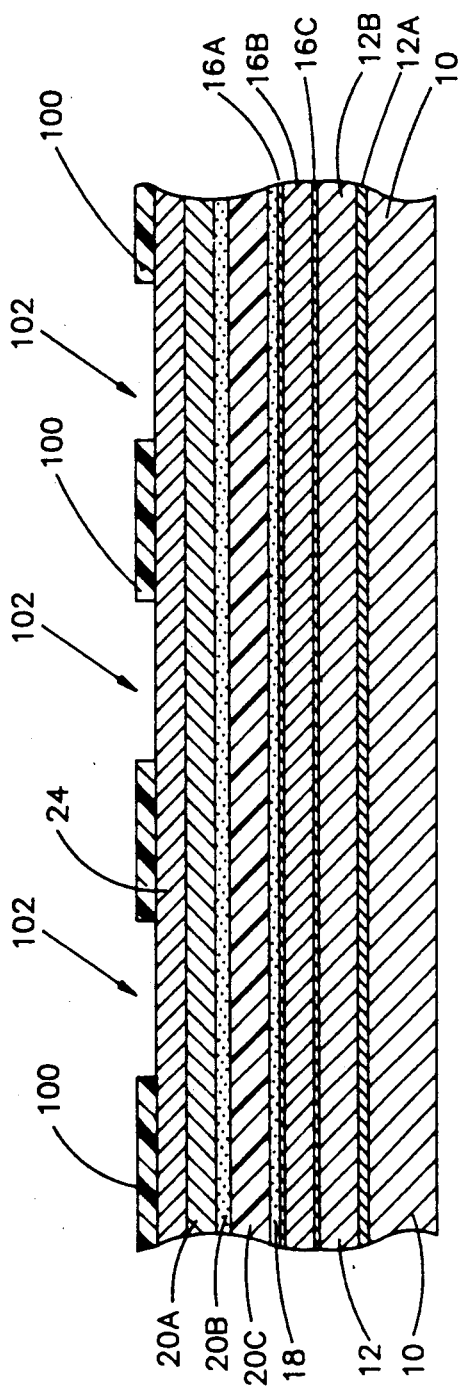
Figure 9C:
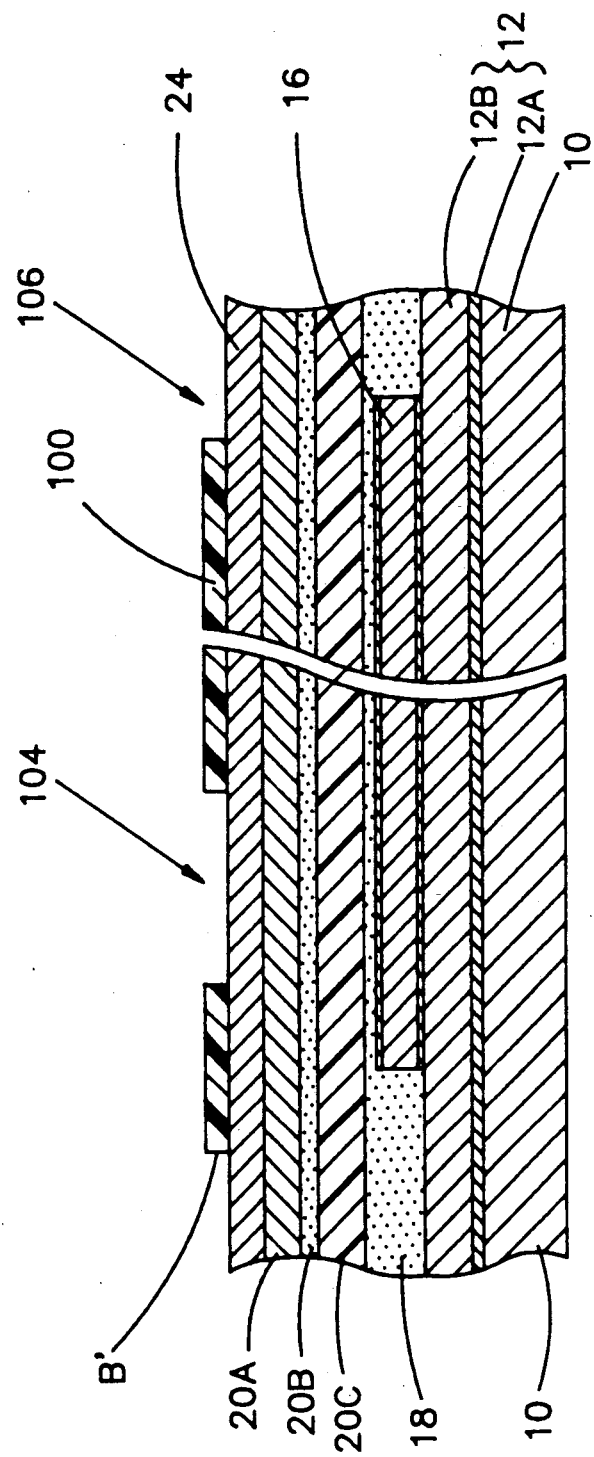

Referring to FIGS. 9A, 9B and 9C, another layer of photoresist 100 is next applied to copper layer 24, and photoresist layer 100 is then imaged and developed to define sites for both (1) a second set of vias for connection between selected ones of the leads 16 and the second voltage (power) plane and (2) inner and outer windows or void areas 26 and 28, respectively, to be formed in the device (see FIGS. 1 and 2), and (3) a peripheral boundary B' for the device for ultimate singulation of the device from the plurality of such devices formed in a single sheet. The resist 100 imaged and developed and with the unexposed resist remold to form the sites 102 for the second set of vias is shown in FIGS. 9A and 9B; the resist imaged and developed to form the sites 106 and 104 for the inner and outer windows and boundary B' is shown in FIG. 9C. The patterning for the second vias, windows and boundary B' is indicated at step I in FIG. 25.

Figure 10A:
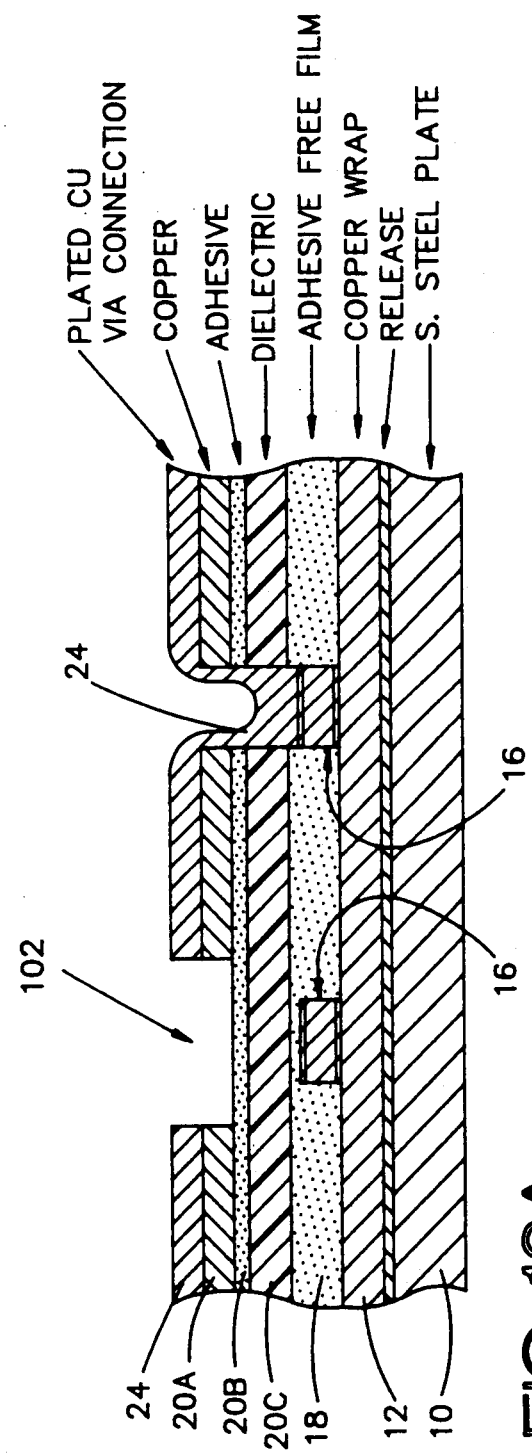
Figure 10B:
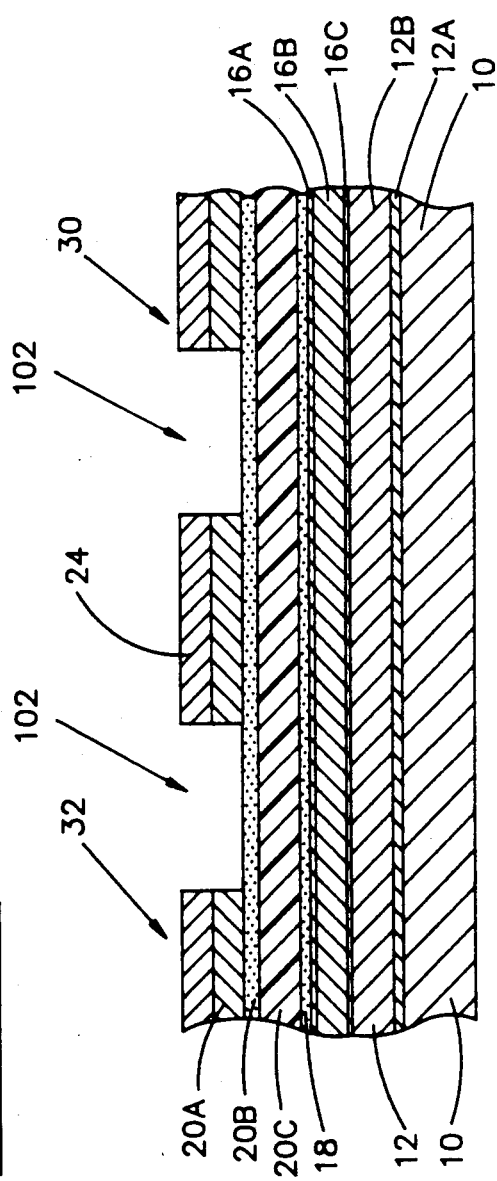
Figure 10C:
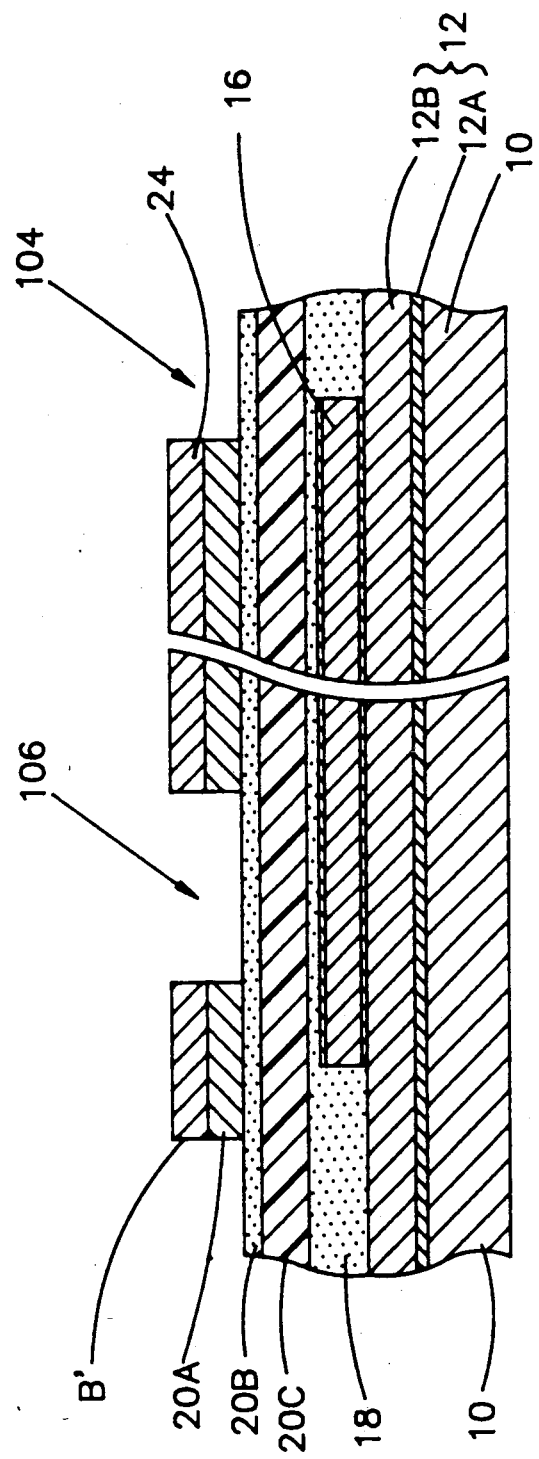

The copper in layers 24 and 20A is then etched to remove the copper at the location of the sites 102, 104, 106 and at boundary B' formed in photoresist layer 100. FIGS. 10A and 10B correspond, respectively, to FIGS. 9A and 9B and show the copper in layers 24 and 20A etched away at sites 102; FIG. 10C corresponds to FIG. 9C and shows the copper in layers 24 and 20A etched away at window sites 104 and 106 and at boundary B'. As depicted in FIG. 10A to show the relationship between the two sets of vias, a second via is shown being formed over an I/O line 16 adjacent to an I/O line 16 connected by a first via to the ground plane 24/20A. This arrangement of the vias connected to adjacent I/0 lines 16 is permissible, but not mandatory. The sites 102, 104 and 106 and the position for boundary B' formed in photoresist 100 and the copper areas etched away in copper layers 24 and 20A are slightly enlarged relative to the actual sizes of the vias and windows and the location of boundary B (see FIGS. 17C, 18 and 19) to be formed in the device, the purpose of this enlargement being to insure that the copper in layers 24, 20A does not act as a mask for a subsequent laser ablation step in which the copper in a third conductive layer (i.e., second voltage plane) will act as the laser mask for forming the windows and second set of vias and boundary B. This enlargement also insures electrical isolation between the second and third planes, during the subsequent steps where the second set of vias are formed, as will be described hereinafter. After the copper in layers 24 and 20A is etched, photoresist 100 is removed. The step of etching to form the window and via sites in copper layers 24, 20A and removing the etch 100 is indicated at Step J of FIG. 25.

Figure 11C:
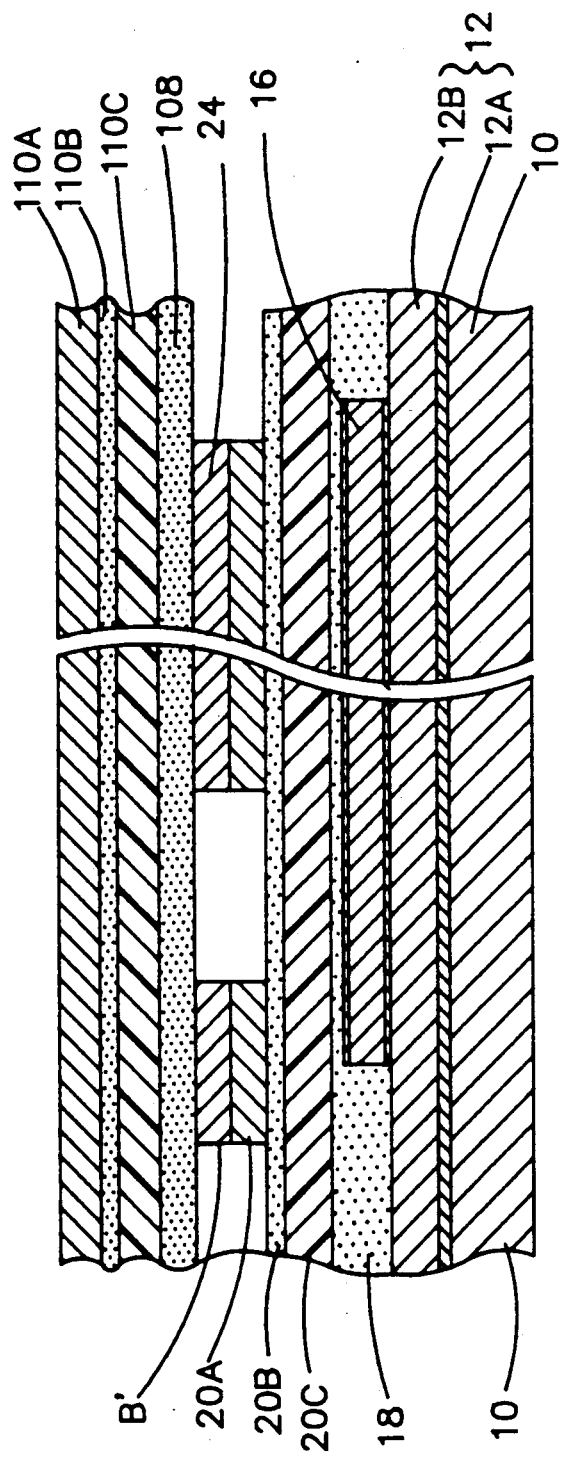
Figure 12C:
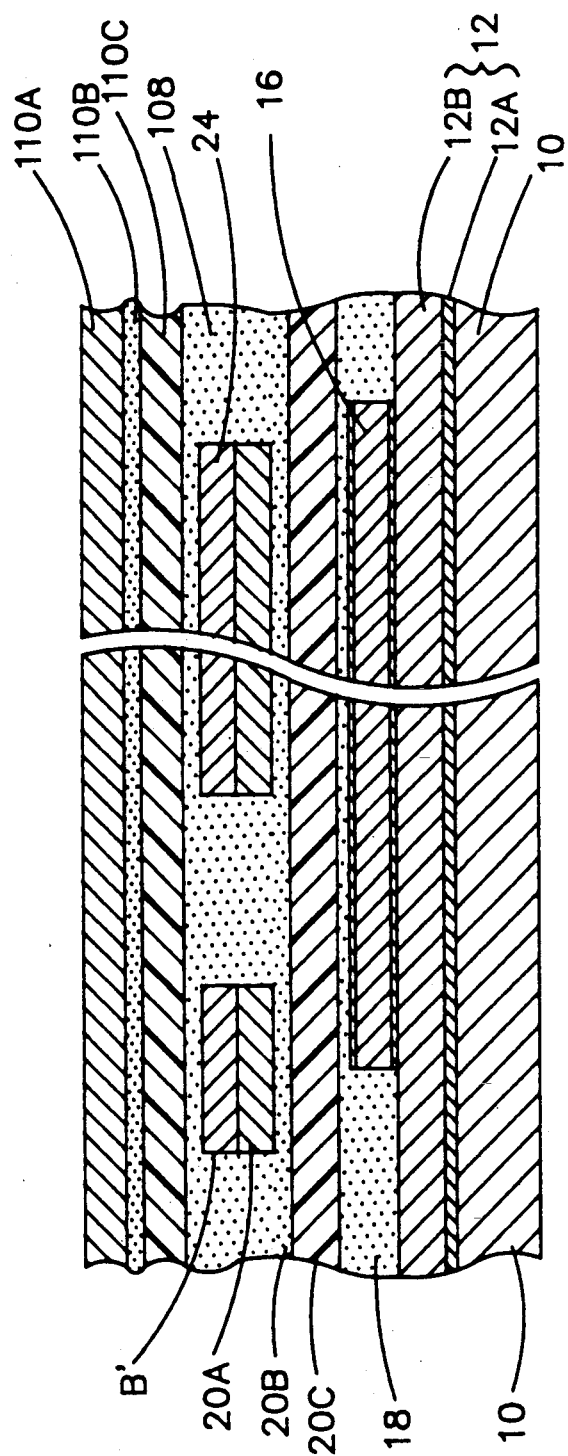

Referring to FIGS. 11A, 11B and 11C (which correspond to FIGS. 10A, 10B and 10C, respectively), next, a single clad laminate 110 of copper bonded to an insulating substrate is placed on top of copper layer 24. The laminate 110 includes an exterior layer of adhesive 108 which is activated by heat and pressure. Adhesive layer 108 is preferably of the same material as adhesive layer 18. This step of positioning laminate 110 is shown at Step K of FIG. 25. Heat and pressure are then applied to bond the laminate 110 to copper layer 24, as shown in FIGS. 12A, 12B and 12C which correspond, respectively, to FIGS. 11A, 11B and 11C. Laminate 110 is preferably the same material as laminate 20; i.e., laminate 110 has a layer of ½ oz. copper 110A bonded by a layer of adhesive 110B to a layer of laser etchable polyimide 110C to which the adhesive 108 is adhered. As with laminate 20, other laser etchable dielectrics and adhesives may also be used; or an adhesiveless laminate may be used where adhesive 110B is eliminated and copper 110A is bonded directly to insulating substrate 110C. Laminate 110 is placed with copper layer 110A facing away from copper layer 24 and with dielectric layer 110C and adhesive 108 facing copper layer 24. The application of heat and pressure causes adhesive 108 to flow into the window and via sites in copper layers 24, 20A and to bond the laminate 110 to copper layer 24. Laminate 110 is prepunched with holes to align with the registration features 15 to leave the registration features visible from the top of the assembly for accurate location of the vias and windows in subsequent manufacturing steps. The step of placing laminate 110 and bonding it to copper layer 24 is indicted at Step L in FIG. 25.

Figure 13C:
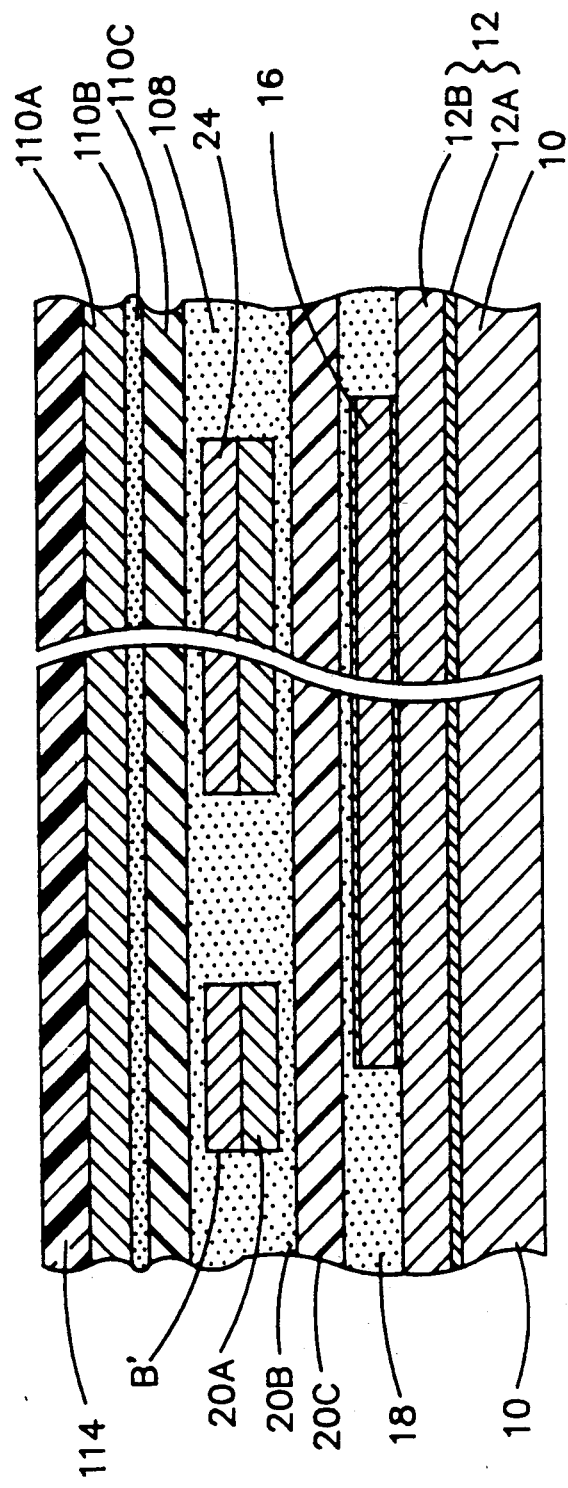
Figure 14C:
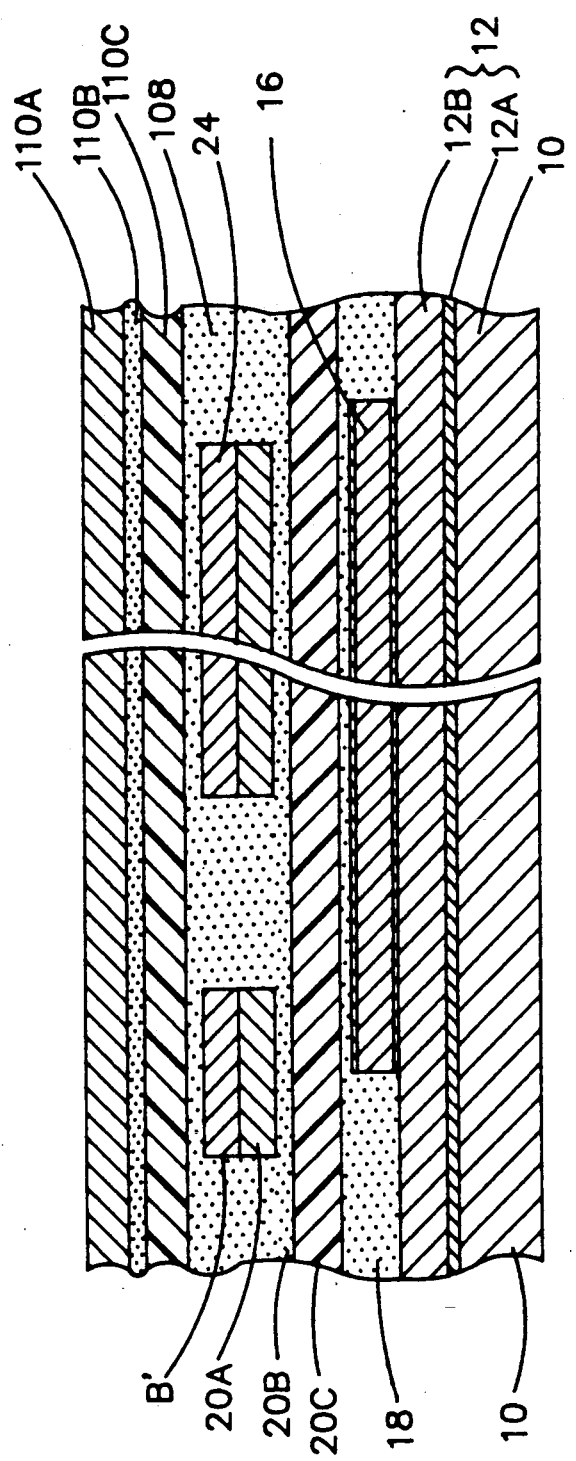

After laminate 110 has been bonded to the assembly, a series of second via holes 112 are formed in the assembly to permit a second series of electrical contacts to be made with leads 16C. Referring to FIGS. 14A and 14B (which correspond to FIGS. 13A and 13B and which show the formed via holes), three of these second via holes 112 are shown, and it will be understood that as many of the second series of via holes as desired can be formed. Preferably, several of the second vias will be formed to connect to each lead 16 which will serve as power lead in the final assembly of the interconnect device to an IC or other electronic component. Referring to FIGS. 13A, 13B and 13C, which correspond, respectively to FIGS. 12A, 12B and 12C, a layer of photoresist 114 is applied to copper layer 110A, and the photoresist 114 is photographically exposed and developed to remove the photoresist only in locations 115 where the second vias are to be formed. The location of the areas where the photoresist is to be removed is accurately determined by reference to previously formed registration features 15. Bearing in mind the fine line (0.002" width or less) of the leads 16 and the fine spacing (0.002" or less), it will be appreciated that the via holes 112 must be accurately located, and the presence of the registration features 15 makes it possible to do so.

After the photoresist has been removed at the locations 115 of the second series of vias, the copper in layer 110A at the via locations 115 is removed by etching to expose adhesive layer 110B (see FIGS. 13A and 13B). The remaining photoresist 114 is then stripped to expose all of the remaining copper surface 110A. The adhesive layer 110B, the dielectric layer 110C and the adhesive layer 108 the adhesive layer 20B, the dielectric 20C and the adhesive 18 in each second via path are then all removed by a suitable laser beam (such as a $CO_2$ or UV laser) acting as a drill. The exposed copper layer 110A constitutes a mask for the laser drill. The laser scans the surface 110 with no effect except in those locations where the copper in layer 110A has been etched away to expose adhesive layer 110B. At those locations, the laser beam drills (ablates) through the dielectric materials of layers 110B, 110C, 108, P, 20C and 18 to expose the plated surface 16C of lead 16. The via holes 112 are then cleaned by any standard technique (e.g., plasma cleaning, vapor honing, etc.) to define sharp and clean walls in the via holes and a clean exposed surface at layer 16C. It is at this point that it is noted that the opening in copper layer 110 determines the size of via 112, because the via passes through the previously formed oversized openings in copper layers 24 and 20A so that those latter copper layers do not perform any masking function for the laser drill. Also, since the ground plane 24/20A is recessed from via 112 and is surrounded by insulating adhesive 108, the ground plane and the power plane (to be subsequently formed) are electrically isolated. The step of forming the second via holes is indicated at step M in FIG. 25.

Figure 15C:
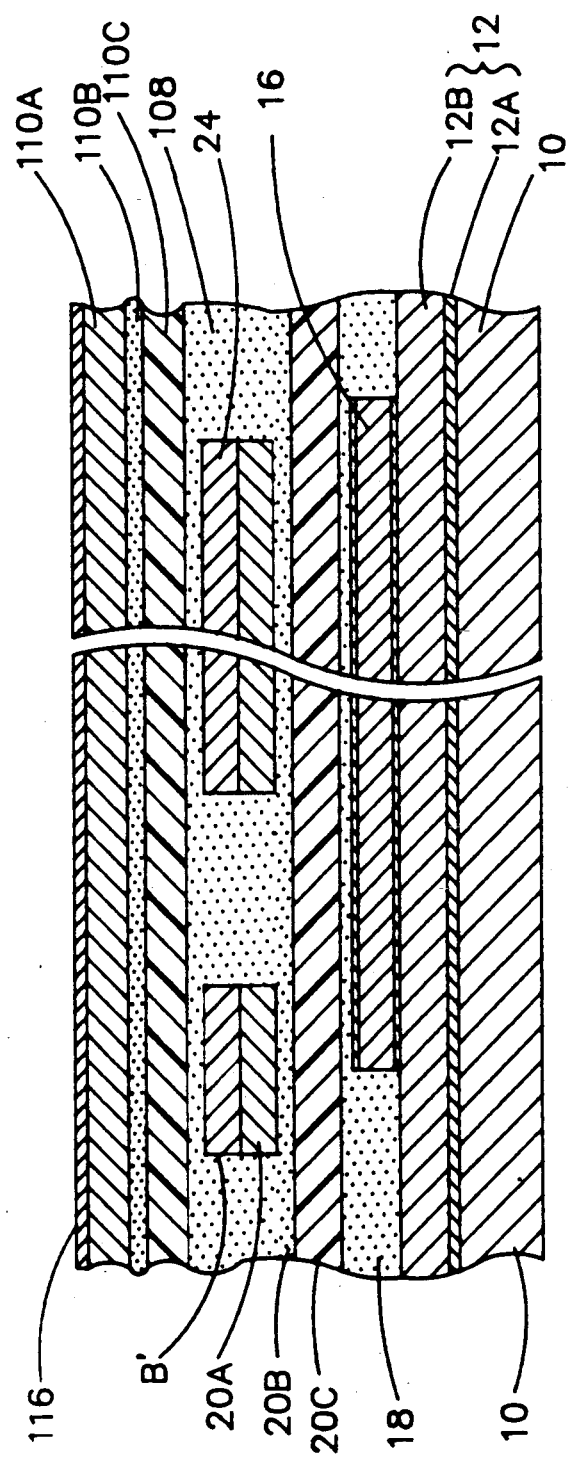

Referring to FIGS. 15A, 15B and 15C (which correspond, respectively to FIGS. 14A, 14B and 14C), copper layer 116 is then plated to leads 16, along the walls of via holes 112 and to the exposed surface of copper layer 110A to complete the second vias and form an electrical connection from selected ones of the leads 16 to copper layer 110A/116 which serves as a power plane in the final product. Copper layer 116 is formed in a two step process where first a very thin layer of copper is formed by electroless deposition or by a vacuum deposition method such as sputtering, and then the remainder of layer 116 is formed by electroplating. The total thickness of layer 116 is about ½ mil (0.0005"). The formation of layer 116 to connect the leads to the power plane is indicated at step N in FIG. 25.

Figure 16C:
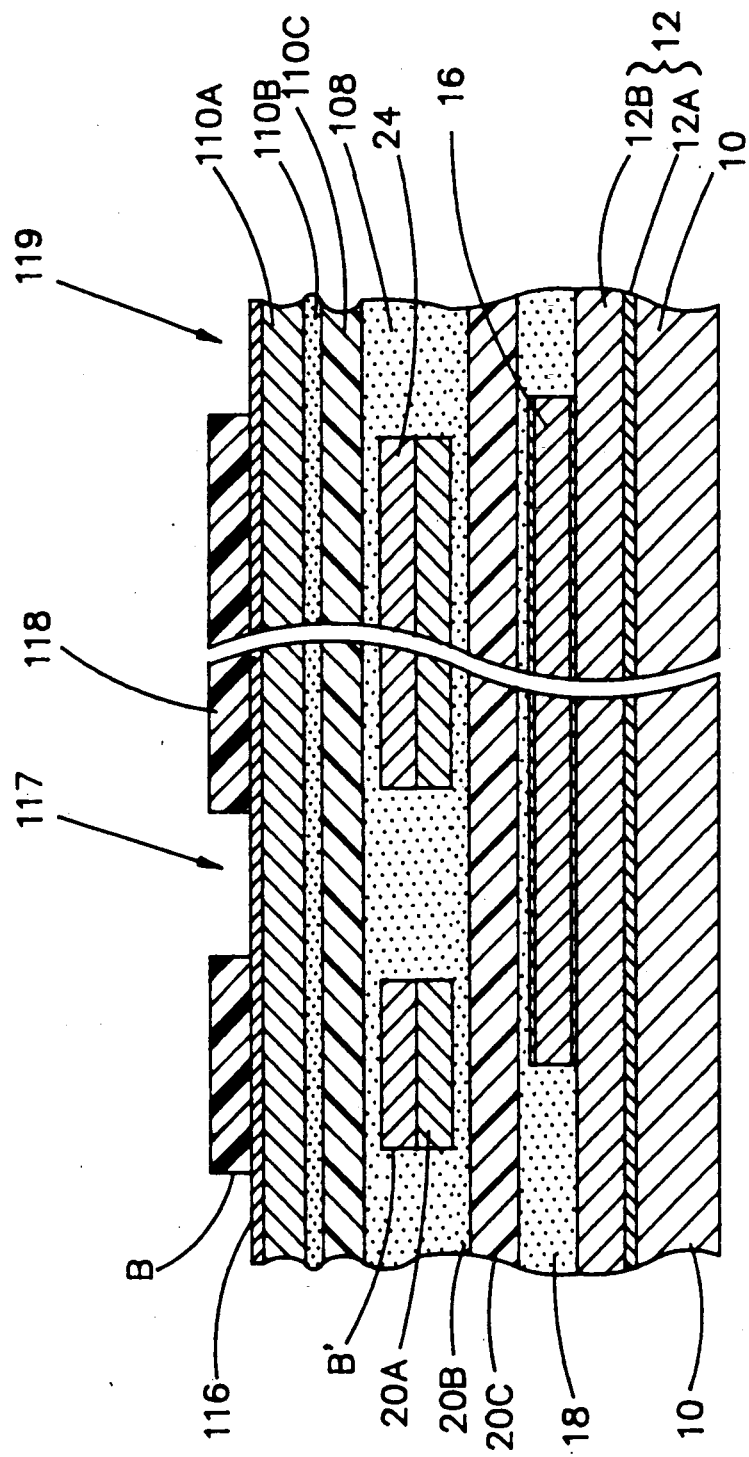

Referring next to FIGS. 16A, 16B and 16C, which correspond, respectively, to FIGS. 15A, 15B and 15C, another layer of photoresist 118 is then applied to copper layer 116, and the photoresist is exposed through suitable artwork to define a pattern of areas or sites 117 and 119 and boundary B (which defines the outer peripheral boundary of each interconnect device in the array) where unexposed resist is washed away to define inner and outer windows or void areas 26 and 28, respectively, to be formed in the device (see FIGS. 1 and 2). The photoresist is removed to expose copper layer 116 only in those areas 117 and 119 where the windows 28, 26, respectively are to be formed (see FIG. 16C) and where the actual peripheral boundary B is to be formed. The exposed copper in layer 116 and layer 110A is then etched to remove the copper to expose adhesive layer 110B where the windows and boundary B are to be formed. The exposed resist prior to etching of exposed copper layer 116 and copper layer 110A is shown in FIG. 16C. After the copper is etched, the photoresist is stripped from the remainder of copper layer 116.

Figure 17C:
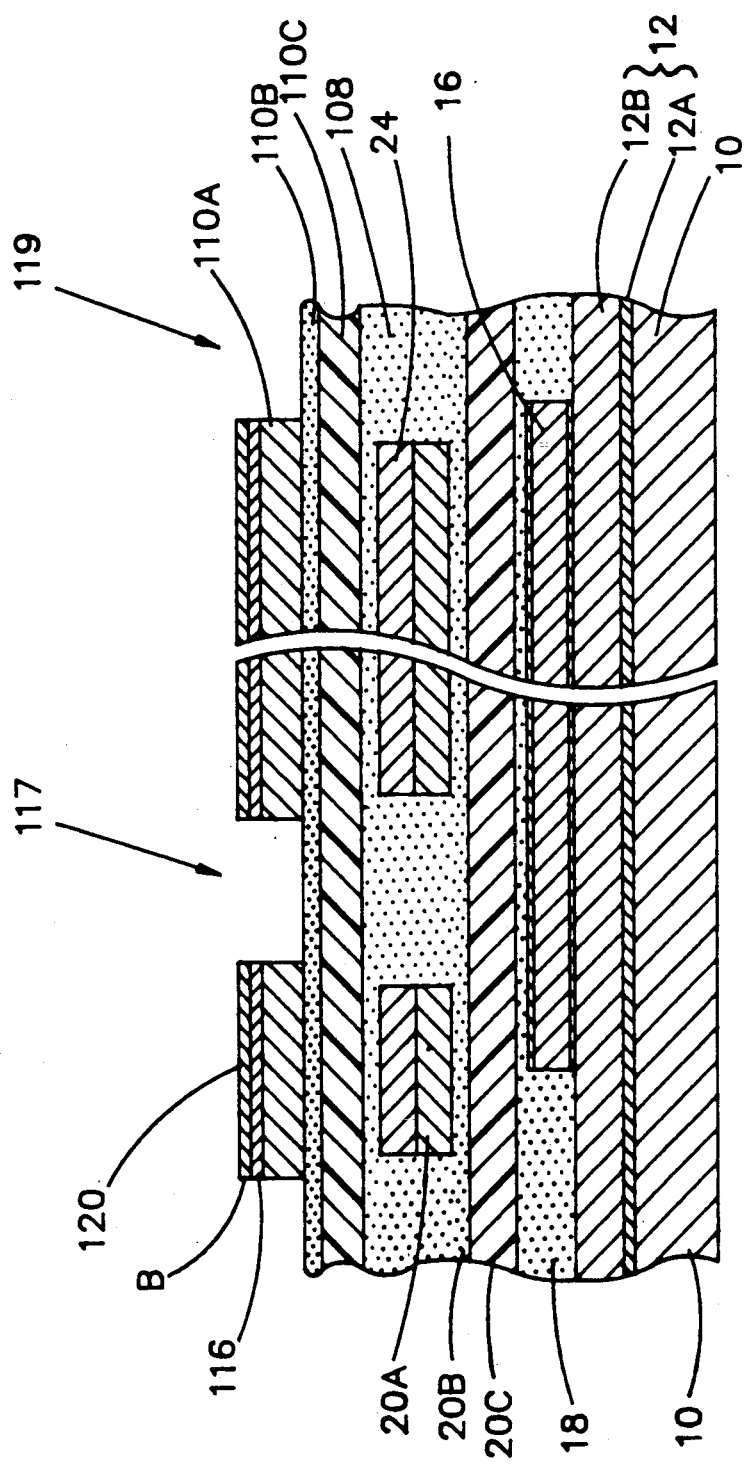

Referring to FIGS. 17A, 17B and 17C, which correspond, respectively to FIGS. 16A, 16B and 16C, a layer of gold, gold or nickel, or other laser resistant material 120 may then be electroplated to layer 116 to protect the power plane against oxidation and against chemical attack during subsequent etching to remove the device from the release layer. Alternatively, a protective fugitive material 28 (to be applied later in the process, see FIG. 19 and related description) can be used to provide such protection. The etching to form the window sites 117 and 119 and boundary B and the optional plating of protective layer 120 is shown at step O of FIG. 25.

Figure 18:
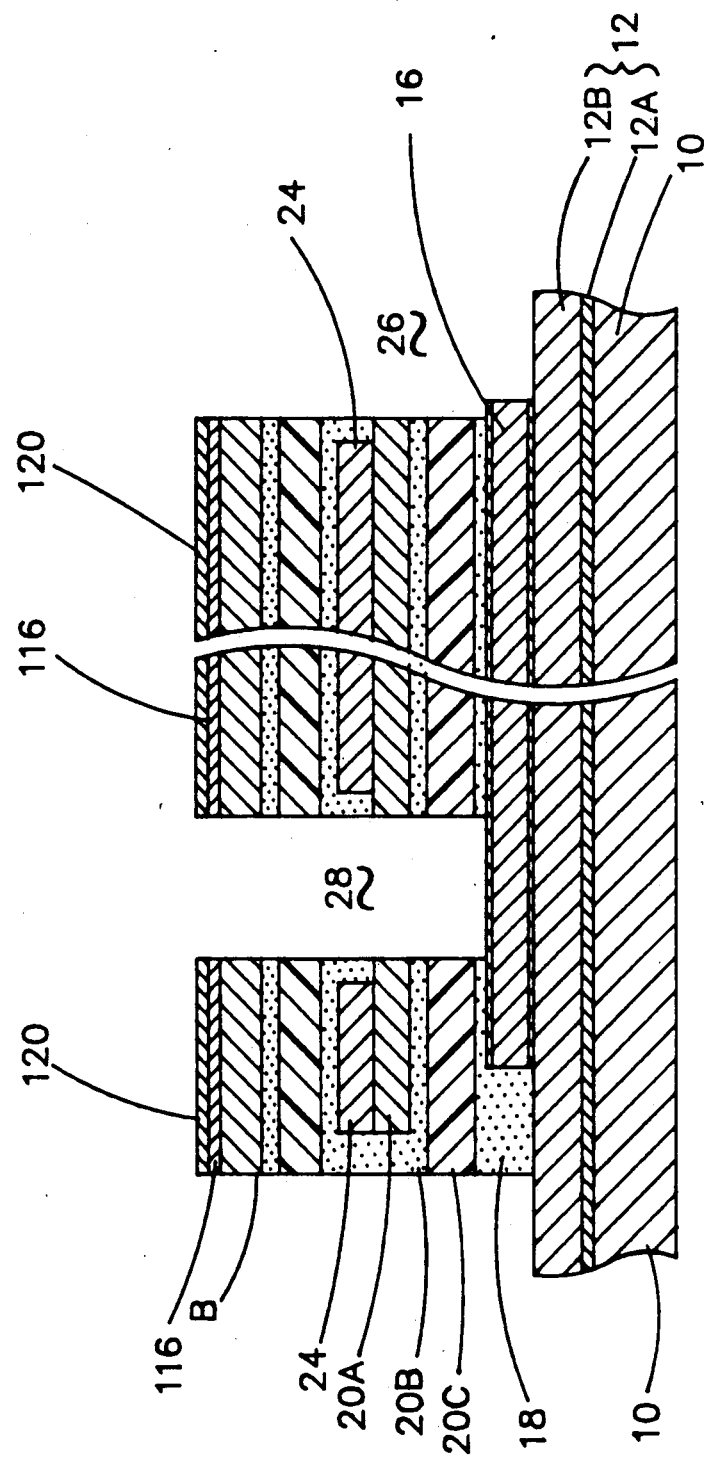
FIGS. 18 and 19 are partial sectional elevation views corresponding to FIG. 17C but showing the device at subsequent stages of manufacture.
Figure 19:
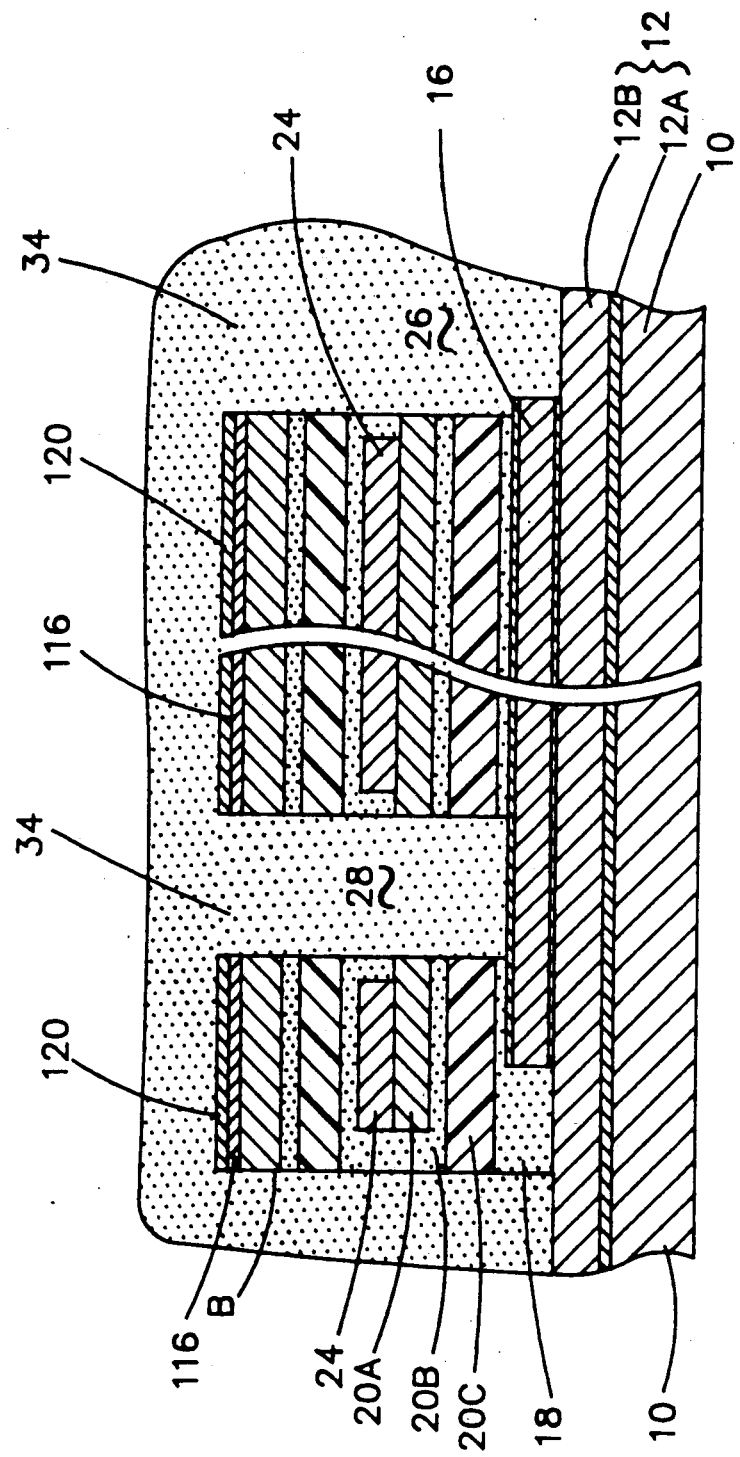

Referring next to FIG. 18, which corresponds to FIG. 17C, in the next step of the process the layers of adhesive 110B, dielectric 110C, adhesives 108 and 20B, dielectric 20C and adhesive 18 at window sites 117 and 119 are ablated by the laser to remove those layers all the way down to leads 16, and down to copper release layer 12B in those areas where the leads 16 are not present. Layer 120/116 acts as a drill mask for the laser for this ablation step. The windows 26, 28 can be seen in FIGS. 1, 2 and 18. The formation of windows 26, 28, leaves an inner support frame 30 for support of leads 16 and an outer support frame 32 on which the leads terminate (see FIGS. 1 and 2). It will be understood that the frames 30 and 32 are formed out of the laminate structure of layers 18, 20, 24, 108, 110 and 116. The formation of windows 26, 28 and frames 30, 32 are indicated at step P of FIG. 25.

It will be noted that the window sites 117 and 119 are formed undersized relative to the previously formed window sites in ground plane 24/20A so that the size of the sites 117 and 119 determine the size of the windows.

During the resist patterning of the power plane to form boundary B, the power plane is preferably resist patterned to leave thin metal connecting tabs running between adjacent corners of adjacent devices. This, then, results in thin connecting tabs consisting of metal (from the power plane) and various layers of dielectric and adhesive at these corner locations which will require die cutting or other mechanical severing for final singulation of the devices. This metal, dielectric and adhesive is shown in FIG. 18, with the addition of a prime (') superscript, e.g., 120', 116', 110A', etc. In step 25 boundary B continues to be formed along with the windows 26 and 28 down to release layer 12B except where the connecting tabs 24'/20A' are located. Note, also, that boundary B overlaps boundary B' in the ground plane.

After the windows 26, 28 and frames 30, 32 and the boundary B have been formed, the windows and the boundary spaces between boundary B of adjacent devices may be filled with a fugitive protective material 34 (see FIG. 19) which covers the power plane, surrounds the leads and extends down to release layer 12 to protect the leads during further processing and handling. This protective material, which should have mechanical and chemical integrity, many, e.g., be a resist material that is ether water or solvent soluble. The protective material may remain in place during storage and/or shipment of the device until the device is used (i.e., until the electronic component is attached to it). The introduction of the protective material is indicated at step Q in FIG. 25. The fugitive protective material also assists in holding the individual parts in a single sheet for subsequent singulation.

After step Q, the carrier plate 10 is removed by (a) breaking the wrap of release layer 12 and (b) separating the carrier 10 from release layer 12. This can be done manually since, as previously discussed, release layer 12 is not strongly adherent to plate 10. After removal of plate 10, release layer remains bonded to leads 16 and adhesive film 18, so it remains necessary to remove release layer 12. This is done by (a) etching away all of nickel layer 12A and then (b) etching away all of copper layer 12B. That leaves the lower surface (gold plated surface 16A) of the leads 16 exposed. This etching is accomplished by the use of two standard etches, the first being specific for nickel and the second being specific for copper. The copper etching step also etches the copper 24/20A at the site of boundary B, thus leaving the individual devices held together by the adhesive layer 20B, dielectric layer 20C and adhesive layer 18. The removal of the support plate 10 and release layer 10 is indicated at step R in FIG. 25.

Upon the removal of plate 10 and release layer 12, the resulting structure consists of a multiplicity of the interconnect devices joined together in a single sheet-like structure. The individual parts are then excised from the sheet-like structure by any convenient means, such as die cutting, laser cutting, etc. The final parts would be as shown in FIGS. 1, 2, at the boundaries B, but without carrier 10 and release layer 12. Of course, protective material 34 will be removed before the part is put into use.

If desired, the gold layers 16A and/or 16C may be removed, where exposed, by selective etching and replaced by other metals, such as tin or solder, for alternate termination processing if desired. Selective metalization can be carried out at any exposed metal surface (e.g., 16A, 16C, 120), whereby different metals can be applied to serve various purposes, e.g., gold for test pads, tin or solder for bonding sites, etc.

Leads 16 are supported by inner frame 30 and extend into window 26. In the end use of the product, an integrated circuit or other electronic component will be positioned in window 26 and will be connected to the innermost ends of leads 16. In ultimate use, after the electronic component has been placed in window 26 and attached to the leads, the outer ends of the leads will be severed at a predetermined location between inner frame 30 and outer frame 32, and the outer ends of leads 16 will then be connected to circuitry with which the electronic component (in window 26) is to be connected and used.

Ground and power voltages will be applied to copper layers 20A, 24 and 110A, 116, respectively to deliver ground and power voltages to desired inputs on the IC or other electronic component. The incorporation of ground and power planes connected by vias to leads 16 significantly simplifies the task of delivering ground and power voltages to the IC or other electronic device. The ground and power voltage levels are supplied to the ground and power planes by selected ones of the lead lines 16 and vias, and the ground and power voltages are supplied through other vias back to those selected leads 16 to serve as ground or power supplies to the IC. That is ground and power are introduced by leads 16, brought up to the respective ground and power planes by vias, where the voltage levels are distributed with less resistance and inductance, and then the ground and power voltages are brought back down to the same leads 16 to be supplied to the IC. The power and/or ground voltages could also be introduced at the location of tabs 30.

The resulting interconnect device is a product which can achieve the following features and advantages:

(1) An interconnect device of the lead frame or TAB type with both ground and power planes resulting in low inductance power distribution and reduced switching noise, particularly with advanced IC's.

(2) Impedance control and low crosstalk realized by the presence of a ground or power plane in close proximity to the signal plane.

(3) The ability to incorporate and distribute multiple power and/or ground voltages within the power and/or ground planes.

(4) Fine line width of 2 mils (0.002") or less.

(5) Fine spacing between leads - the spacing being 2 mils (0.002") or less.

(6) Center-to-center control of the cantilevered lead ends to within about ±0.0003".

(7) Positioning of the cantilevered ends of the leads to a tolerance of about ±0.002 to registration features.

(8) Lead planarity (i.e., alignment in a plane within a tolerance of about ±0.001".

(9) Selective application of surface metals (gold, tin, solder, etc.) to improve performance in various applications (testing, bonding, etc.)

Of course, it is possible to practice the method of this invention under less than optimum process control conditions and produce the product of this invention which does not achieve some or all of the above features and advantages. Such product and process would, nevertheless, be within the scope of the present invention. Also, it is to be noted that additional voltage plane layers, e.g., 3 or more, can be incorporated by repeating the process steps by which the second voltage layer was formed as disclosed herein.

Figure 20:
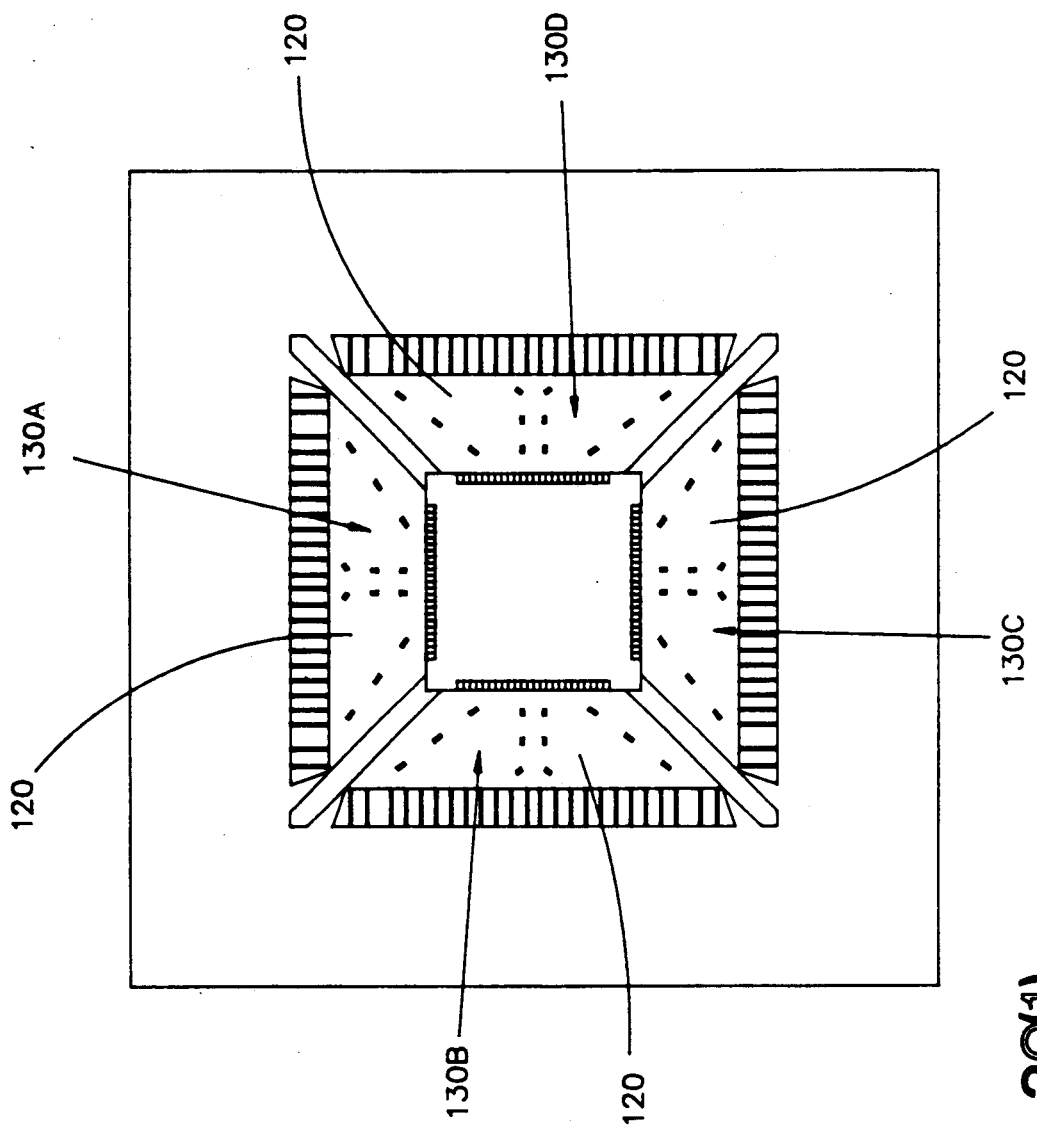
FIGS. 20(1) and 20(2) show a modification wherein the voltage plane and the ground plane are segmented.

It should be noted that both the power plane (and the ground plane, if desired) can be split into several electrically isolated segments to deliver different power and reference voltages. FIG. 20(1) shows a power plane split into four power segments 130A, B, C, D, used with a single ground plane. Four different power voltages are supplied to each of the power plane segments 130A, B, C, D, and one ground voltage is supplied to the ground plane. FIG. 20(2) shows the ground plane split into four reference segments 132A, B, C, D to be paired, respectively, with the prior segments 130 A, B, C and D. In this embodiment, four different power voltage levels are supplied to segments 130A-D, and four different reference voltages are supplied to segments 132A-D. The segmenting of the power voltage plane makes it possible to pair power and ground levels and isolate any power level that is particularly noisy from the rest of the unit. For example, if the four voltage levels $V_A$-$V_D$ are paired with the four reference levels $G_A$-$G_D$, and if one of the power levels (e.g., $V_A$) is particularly noisy, the noisy voltage level (e.g., $V_A$-$G_A$) can be isolated from the rest of the voltage supplies. Although all segmenting of voltage planes have been shown in quadrants, it will also be understood that the voltage planes could also be further segmented within any quadrant, or segmentation could be in any other desired pattern.

Figure 21:
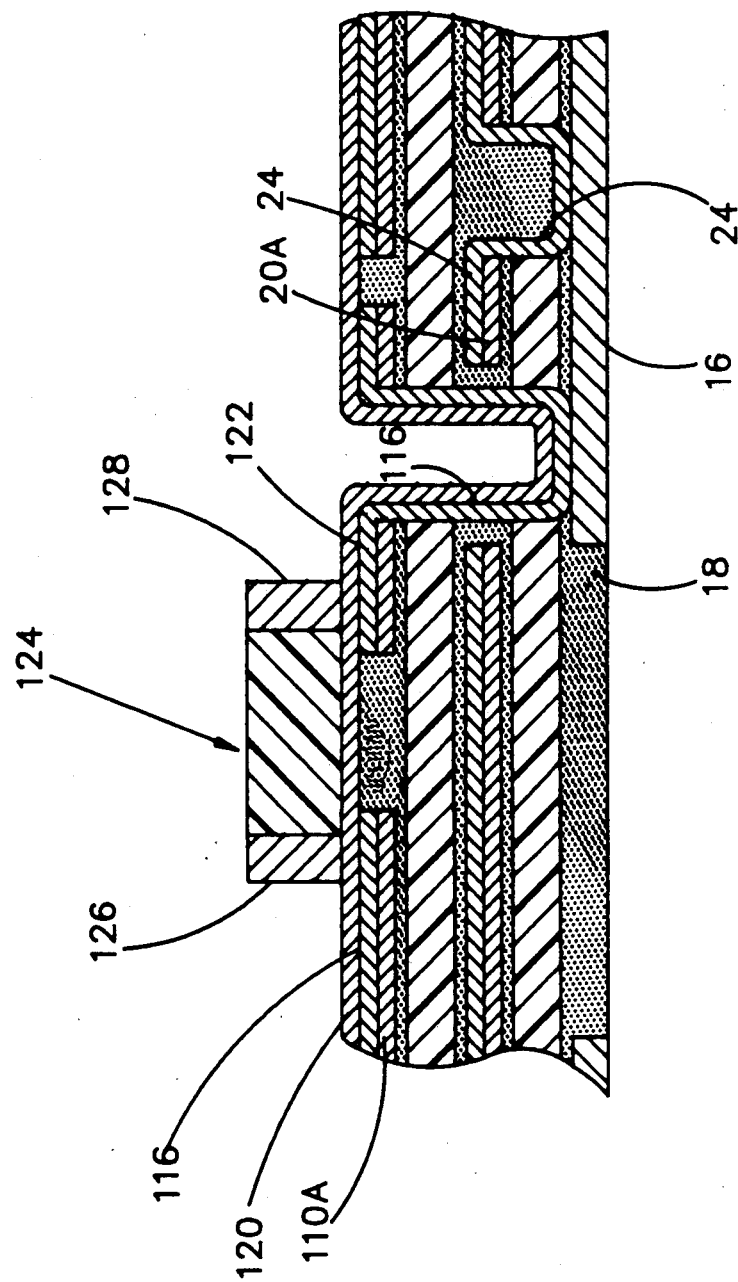
FIG. 21 is a partial sectional elevation view showing an embodiment wherein a decoupling capacitor is incorporated.

FIG. 21 shows the interconnection device of the present invention incorporating a decoupling capacitor 124 which is connected between the power and ground planes. Capacitor 124 has conductive plates 126 and 128 spaced apart by a suitable dielectric. Plate 126 is connected (as by soldering or otherwise) directly to the power plane by being bonded to gold layer 120. (If gold layer 120 is omitted, then plate 126 is bonded directly to power plane 116/110A.) The other plate 128 of the capacitor is connected to an electrically isolated segment 122 of the power plane. That is, segment 122 is originally formed as part of the power plane 120/116/110A, but segment 122 is subsequently electrically isolated from the power plane by photoresist masking and etching completely around segment 122 so that segment 122 is electrically isolated from the power plane although it remains physically at the level of the power plane. That masking and etching to electrically isolated segment 122 from the power plane can be accomplished as a part of Step O or as a separate step between Steps P and Q. Segment 122 is connected by a via of the second set of vias to a decoupling capacitor lead 16' (formed at the same time as leads 16), and lead 16' is connected to the ground plane 24/20A by a via of the first set of vias. Thus, plate 128 is connected to the ground plane; and the capacitor 124 is connected across the power and ground planes for decoupling purposes.

As previously indicated, certain of the leads 16 will serve as ground leads to connect an IC or other electronic component to the ground of external circuitry; and certain of the leads 16 will serve as power leads to connect an IC or other electronic component to the power of external circuitry. Each such ground lead 16 will be connected to the ground plane 24/20A by at least two of the first vias at spaced apart points along that ground lead 16, one such point being preferably adjacent the outboard end of the lead 16 (i.e., in the vicinity of the window 28) and the other such point being at an appropriate place inboard thereof (i.e., toward window 26). In this way the ground voltage will be delivered from the external circuitry to the ground lead 16 and to the ground plane by the outboard via and from the ground plane to the lead 16 by the inboard via. Similarly, each power lead 16 will be connected to the power plane 116/110A by at least two of the second vias at spaced apart points along that power lead 16, one such point being preferably adjacent the outboard end of the lead 16 and the other such point being at an appropriate point inboard thereof. In this way the power voltage will be delivered from external circuitry to power lead 16 and to the power plane by the outboard via and from the power plane to the lead 16 by the inboard via. Also, if desired, some of the ground and power leads 16 need not be connected to the external circuitry, but can be maintained at the desired power and ground levels for their connections to the IC by one or more via connections to the power and ground planes, respectively.

In the manufacturing process described above, it is necessary at certain steps to refer to the registration features 15. To obtain sight of the registration features during all manufacture steps, the resist material is translucent, and holes are formed at appropriate places in all layers of laminate used in building up the product.

Figure 22:
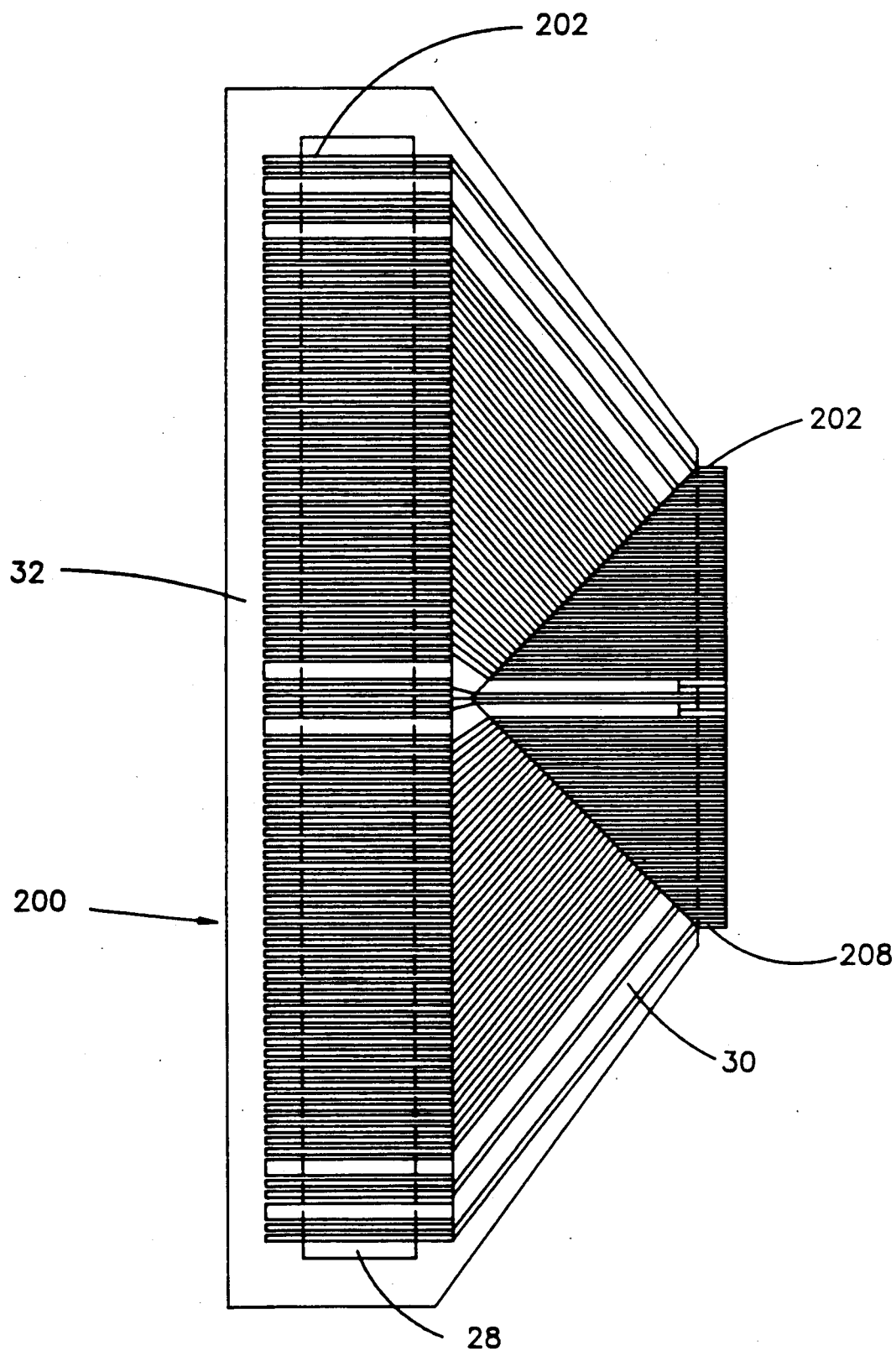
FIG. 22 is a top plan view of another interconnect device made in accordance with the present invention.
Figure 23:
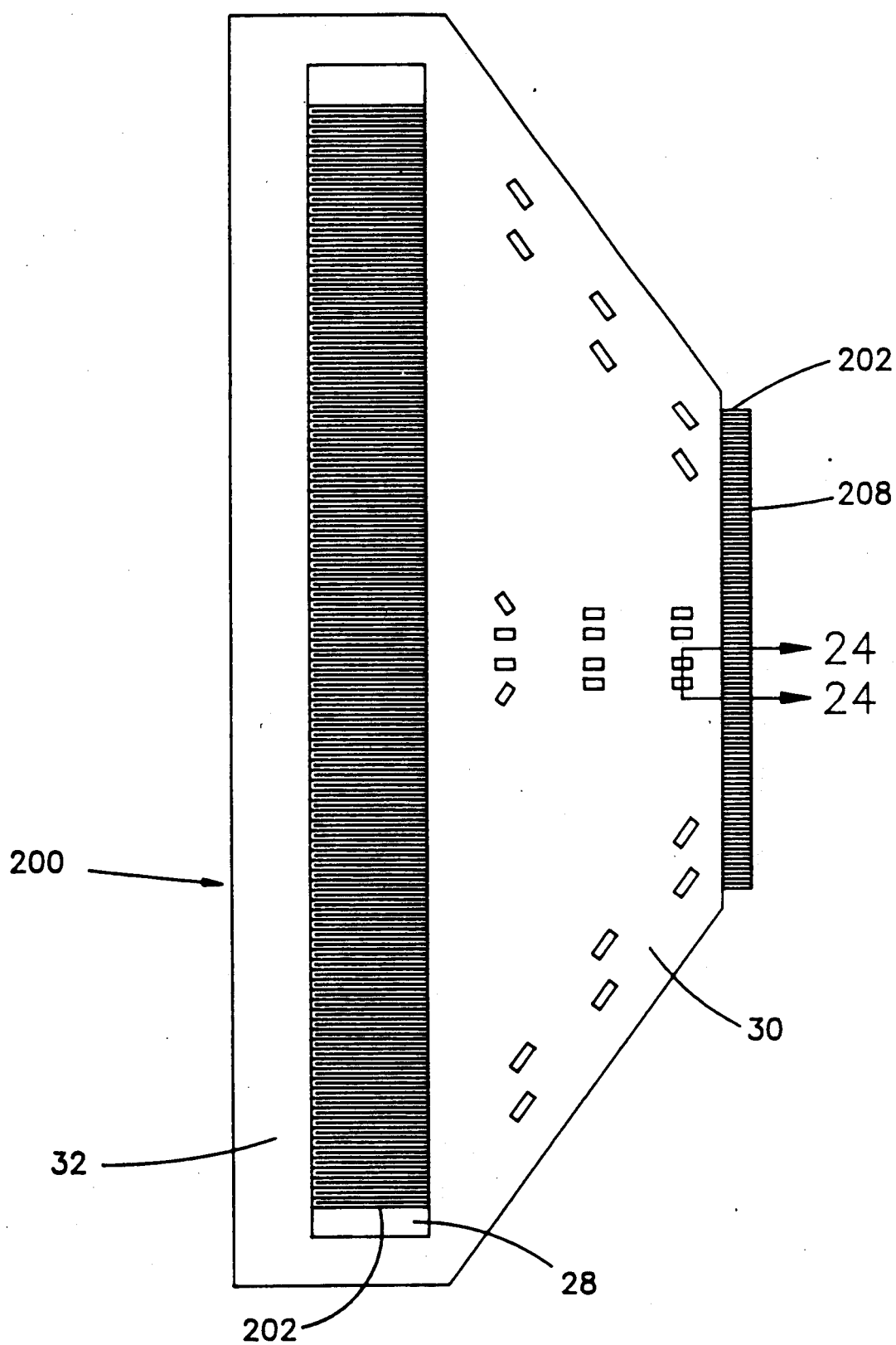
FIG. 23 is a bottom plan view of the device of FIG. 22.

FIGS. 22, 23 and 24 show another interconnect device made in accordance with the present invention. The item of FIGS. 22 and 23 is a high density interconnect device 200 for connecting a high density multichip module to a printed circuit board. The individual leads 202 (which are like leads 16) are seen on the upper surface of the device in FIG. 22. As seen in the cross-section elevation view of FIG. 24, interconnect device 200 also has a ground plane 204 (corresponding to layer 24/20A) and a first set of conductive vias 206 (corresponding to vias 22) which connect the plane 204 to selected ones of the leads 202 and a second set of vias 212 (corresponding to vias 112) which connect the power plane 214 (corresponding to layers 120/116, 110A) to selected other leads 202. One of the ends 208 of the leads 202 are unsupported (i.e., they extend from interconnect device 200 in a cantilevered manner), and these unsupported lead ends form the actual interconnects to contact points on a high density multichip module. The other ends of the leads (which extend across the equivalent of window 28 and would be severed at some intermediate point for use) are for connection to a PC board. Other parts of the device of FIGS. 22-24 are labeled with numbers the same as the corresponding parts in the previous embodiment. The device of FIGS. 22-24 is also made by the process of steps A-R of FIG. 25.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of making an interconnect device for electronic components comprising the steps of:

forming a release layer on a carrier plate;

forming a conductive pattern of leads on said release layer;

bonding a first laminate to said conductive pattern of leads, said laminate including a first conductive sheet and a first dielectric sheet wherein said first dielectric sheet faces said conductive pattern of leads and said second conductive sheet faces away from said conductive pattern of leads;

forming a first plurality of via holes in said first laminate in a predetermined pattern, said via holes extending through said first conductive sheet and first dielectric sheet and exposing a first selection of leads;

depositing a first conductive material in said first via holes and onto said first conductive sheet of said first laminate to interconnect said first selection of leads to said first conductive sheet, said first conductive sheet and the first conductive material thereon defining a first voltage plane for the interconnect device;

forming a plurality of second via sites in a predetermined pattern in said first voltage plane;

bonding a second laminate to said first voltage plane, said second laminate including a second dielectric sheet facing said first voltage plane and a second conductive layer facing away from said first voltage plane;

forming a second plurality of via holes in said second laminate and in said first laminate at said second plurality of via hole sites, said second plurality of via holes extending through said second conductive sheet, said second dielectric sheet, said first voltage plane, and said first dielectric sheet and exposing a second selection of said leads;

depositing a second conductive material in said second via holes and onto said second conductive sheet of said second laminate to interconnect said second selection of leads to said second conductive sheet, said second conductive sheet and the second conductive material thereon defining a second voltage plane for the interconnect device; and forming at least one window in said interconnect device by removing selected parts of said first and second laminates and said first and second conductive materials if present where said window is to be formed, said window exposing said leads and forming a site for location of an electronic component to be connected to said interconnect device.

2. The method of claim 1 wherein said step of forming a plurality of second via holes includes:

removing at each of said second via sites a second via area of said first voltage plane, said second via area of said first voltage plane being greater than the cross-sectional area of the second via to be formed;

filling each of said second via areas of said first voltage plane with insulating material;

removing from said second conductive sheet at each location where a second via is to be formed, a second via area of said second conductive sheet, said second removed via area of said second conductive sheet being smaller in cross section than said second via area of said first voltage plane whereby said second conductive sheet with said second removed via area thereof serves as a mask to define the cross sectional area of each of the second vias; and removing at each of the second via sites part of the second dielectric sheet, part of the insulating material filling the first removed via area, and part of the first dielectric sheet to expose said second selection of leads.

3. The method of claim 1 wherein said step of forming at least one window includes:

removing a first window area of said first voltage plane greater than the cross-sectional area of the window to be formed;

filling said first removed window area with an insulating material;

removing a second window area of said second voltage plane, said second removed window area being smaller than said first removed window area whereby said second voltage plane with said second removed window area serves as a mask to define the cross sectional area of the window; and removing at the window site part of the second dielectric sheet, part of the insulating material filling the first removed window area, and part of the first dielectric sheet to expose a part of said leads.

4. The method of claim 1 including the steps of:

forming a second window spaced from and surrounding said first window to define at least one frame surrounding said window in said device by removing selected parts of said first and second voltage planes and said first and second laminates, said second window exposing said leads.

5. The method of claim 4 wherein said step of forming a frame includes:

removing a second window defining area of said first voltage plane greater than the cross-sectional area of the second window to be formed;

filling said second window defining area with an insulating material;

removing a second window defining area of said second voltage plane, said second removed window defining area of said second voltage plane being smaller than said second removed window defining area of said first voltage plane whereby said second voltage plane with said second removed frame defining area serves as a mask to define the cross sectional area of the second window; and removing at the second window defining site part of the second dielectric sheet, part of the insulating material filling the second removed window defining area of the first voltage plane, and part of the first dielectric sheet to expose a part of said leads.

6. The method of claim 1 further including the step of:

connecting a decoupling capacitor between said first voltage plane and said second voltage plane.

7. The method of claim 6 wherein the step of connecting a capacitor includes:

forming an electrically isolated island in said second power plane;

connecting said first power plane to one of said leads by a first via;

connecting said island to said one lead by a second via;

connecting a first one plate of said capacitor to said second voltage plane; and connecting a second plate of said capacitor to said island.

8. An interconnect device for electronic components formed by the process of claim 1.

9. A method of making an interconnect device for electronic components comprising the steps of:

forming a release layer on a carrier plate;

forming a conductive pattern of leads on said release layer;

bonding to said pattern of leads a first laminate, the laminate including a first layer of adhesive adjacent to said leads, a first dielectric sheet, a first dielectric sheet, a first intermediate layer of adhesive, and a first conductive sheet, said first conductive sheet facing away from said leads;

forming a plurality of first via holes in a predetermined pattern by (a) selectively removing first via hole areas of said first conductive sheet; and (b) selectively removing the first intermediate layer of adhesive, the first dielectric sheet, and the first layer of adhesive in the areas of alignment of each with said first via hole areas to expose parts of a first selection of said leads;

depositing a first conductive material in each of said first via holes and onto said first conductive sheet of said first laminate to interconnect said first selection of leads to said first conductive sheet which serves as a first voltage plane in the intermediate device;

forming a plurality of second via sites in a predetermined pattern and forming at least one window site by contemporaneously (a) selectively removing second via site areas from said first voltage plane; and (b) removing at least a first window area from said first voltage plane;

bonding to the assembly thus formed a second laminate, the laminate including a second layer of adhesive adjacent to said first voltage plane, a second dielectric sheet, a second intermediate layer of adhesive, and a second conductive sheet, said second conductive sheet facing away from said first voltage plane, said second layer of adhesive filling said second via site areas and said first window area in said first voltage plane;

forming a plurality of second via holes in a predetermined pattern aligned with said second via sites in said first voltage plane by (a) selectively removing second via hole areas from said second conductive sheet; and (b) selectively removing the second intermediate layer of adhesive, the second dielectric sheet, part of the adhesive filling said second via site areas in said first conductive material and said first conductive sheet, said first intermediate adhesive layer, said first layer of dielectric, and said first layer of adhesive in the areas of alignment of each with said second via hole areas in said second conductive sheet to expose parts of a second selection of said leads;

depositing a second conductive material in said second via holes and onto said second conductive sheet of said second laminate to interconnect said second selection of leads to said second conductive sheet which serves as a second voltage plane in the interconnect device; and forming at least one window by
- (a) removing a second window area from said second voltage plane; and
- (b) removing the second intermediate layer of adhesive, the second dielectric sheet, part of the adhesive filling said first window area in said first conductive material and said first conductive sheet, said first intermediate adhesive layer, said first layer of dielectric, and said first layer of adhesive in the areas of alignment of each with said second window area to expose parts of said leads;

removing the interconnect device thus formed from said carrier plate by separating said release layer from said carrier plate; and removing said release layer from the interconnect device thus formed.

10. The method of making an interconnect device as in claim 9 wherein:
said step of forming a plurality of second via sites includes removing at each of said second via sites a second via area of said first voltage plane of a cross sectional area greater than the cross sectional area of the via to be formed; and
said step of forming a plurality of second via holes includes:
- (a) removing second via hole area from said second conductive sheet of a cross sectional area smaller than the cross sectional area of the second via area removed from said first voltage plane, and
- (b) using said second conductive layer and the second via hole areas formed therein as a mask and pattern, and
- (c) removing at each of the second via sites part of the second intermediate layer of adhesive, the second dielectric sheet, part of the adhesive filling said second via site areas in said first voltage plane, said first intermediate adhesive layer and said first dielectric sheet in a cross sectional area determined by the smaller cross sectional area of the second via hole areas formed in said second conductive sheet.

11. The method of forming an interconnect device as in claim 9 wherein said step of forming a window includes:
removing from said window site in said first voltage plane a first window area greater in cross section than the window to be formed;
removing from said second voltage plane a second window site smaller in cross section than the first window area formed in the first voltage plane; and
using said second voltage plane and said smaller cross section second window site formed therein as a mask and pattern; and
removing at said second window area part of the second intermediate layer of adhesive, the second dielectric sheet, part of the adhesive filling said second window site in said first voltage plane, said first intermediate adhesive layer and said first dielectric sheet in a cross sectional area determined by the small cross sectional area of said second window site.

12. The method of claim 9 including the step of:
forming a second window spaced from and surrounding said first window to define at least one frame surrounding said window in said device by removing selected parts of said first and second voltage planes and said first and second laminates, said second window exposing said leads.

13. The method of making an interconnect device as in claim 12 wherein said step of forming a frame includes:
removing a second window area of said first voltage plane greater than the cross-sectional area of the second window area to be formed;
filling said second window area of said first voltage plane with an insulating material;
removing a second window area of said second voltage plane, said second area of said second voltage plane being smaller than said second window area of said first voltage plane whereby said second voltage plane with said second window area removed therefrom serves as a mask to define the cross sectional area of the window to be formed; and
removing at the site of the second window to be formed part of the second intermediate layer of adhesive, part of the second dielectric sheet, part of the insulating material filling the first removed frame area, part of the first intermediate layer of adhesive, part of the first dielectric sheet, and part of the first layer of adhesive to expose a part of said leads.

14. The method of claim 9 wherein:
the steps of forming a conductive pattern of leads on the release layer, removing the first via hole area in said first conductive sheet, removing the second via site areas in said first voltage plane, removing a first window area from said first voltage plane, removing second via hole areas from said second conductive sheet, and removing a second window area from said second voltage plane are all accomplished by resist patterning and etching.

15. The method of claim 12, further including the step of:
depositing a layer of etch protective material on said second conductive material after the step of depositing the second conductive material in the second via holes and onto the second conductive sheet.

16. The method of claim 9 including the steps of:
forming at least one registration feature on said release layer when said conductive pattern of leads is formed; and
referring to said registration feature to determine the locations of said first via holes, said second via holes ad said window.

17. The method of claim 9 wherein:
the steps of forming the first via holes, the second via holes and the window includes removal by laser ablation of all nonconductive materials at the locations of said first via holes, said second via holes and said window.

18. The method of claim 9 wherein:
said first conductive material of said first voltage plane and said second conductive material of said second voltage plane are deposited by a process of electroless deposition followed by electroplating.

19. The method of claim 9 wherein:
said carrier plate comprises a rigid body having an electrically conductive surface.

20. The method of claim 19 wherein:
said carrier plate is stainless steel.

21. The method of claim 9 wherein:

said release layer comprises at least one layer of metal plated on a front surface of said carrier plate.

22. The method of claim 21 wherein said carrier plate includes sides and a back surface, and wherein:
said release layer is wrapped around said sides and extends along a portion of said back surface.

23. The method of claim 19 wherein said release layer comprises:
a first layer of nickel electroplated to said carrier plate; and
a second layer of copper electroplated to said first layer of nickel.

24. The method of claim 9 further including the step of:
connecting a decoupling capacitor between said first voltage plane and said second voltage plane.

25. The method of claim 9 wherein the step of connecting a capacitor includes:
forming an electrically isolated island in said second power plane;
connecting said first power plane to one of said leads by a first via;
connecting said island to said one lead by a second via;
connecting a first one plate of said capacitor to said second voltage plane; and
connecting a second plate of said capacitor to said island.

26. An interconnect device for electronic components formed by the process of claim 9.

27. An interconnect device for electronic components comprising:
a conductive pattern of leads bonded to a first sheet of dielectric on one side thereof;
a first conductive sheet bonded to said first dielectric sheet on the side thereof opposite to said leads;
electrically conductive material extending along said first via holes and over said conductive sheet and cooperating with said first conductive sheet to define a first voltage plane and vias electrically interconnecting said first plurality of said leads with said first voltage plane;
a second dielectric sheet bonded to said first voltage plane;
a second conductive sheet bonded to said second dielectric sheet;
a plurality of second via holes extending through said second conductive sheet, said second dielectric sheet, said first voltage plane and said first dielectric sheet to a second plurality of said leads;
electrically conductive material extending along said second via holes and over said second conductive sheet and cooperating with said second conductive sheet to define a second voltage plane and vias electrically connecting said second plurality of said leads with said second voltage plane; and
said second via holes and the electrically conductive material extending along said second via holes passing through an opening in said first voltage plane of larger cross section than said second via holes and being surrounded by insulating material to prevent electrical contact between the conductive material in said second via holes and said first voltage plane.

28. An interconnect device for electronic components as in claim 27, including:
at least one window through said second voltage plane, said second dielectric sheet, said first voltage plane and said first dielectric sheet, said window exposing said leads;
said vias, window and frame being formed at least in part by laser etching wherein said conductive sheet forms a mask for laser etching of said via holes and said conductive layer forms a mask for laser etching of said window and frame.

29. An interconnect device for electronic components as in claim 28 including:
a second window spaced from and surrounding said first window and defining at least a first frame between said first and second windows, said second window exposing said leads.

30. An interconnect device for electronic components as in claim 27 wherein:
with respect to any second via, the opening in the second conductive sheet for the second via hole is smaller in cross section than the corresponding opening for that second via in the first voltage plane, whereby a space is defined in said first voltage plane surrounding and spacing the second via from the first voltage plane where the second via passes between the first voltage plane, said space being filled with an insulating material.

31. An interconnect device for electronic components as in claim 27 including:
decoupling capacitor means connected between said first voltage plane and said second voltage plane.

32. An interconnect device for electronic components as in claim 27 including:
decoupling capacitor means connected between said first voltage plane and said second voltage plane;
a first plate of said decoupling capacitor means being connected directly to said second voltage plane; and
a second plate of said decoupling capacitor means being connected to said first voltage plane by a first via connected from said first voltage plane to one of said leads and a second via connected from said second plate to said one lead.

33. An interconnect device as in claim 32 wherein:
said second plate and said second via are each connected to a portion of said second voltage plane which is electrically isolated from the remainder of said second voltage plane.

34. An interconnect device for electronic components comprising:
a first laminate of a first dielectric layer bonded to a first conductive layer;
a plurality of leads bonded to said first dielectric layer;
a plurality of first vias extending from said first conductive layer to a first plurality of said leads, said first vias including a first layer of conductive material extending over said first conductive layer;
said first conductive layer and said conductive material extending thereover defining a first voltage plane;
a second laminate having a second dielectric layer bonded to a second conductive layer, said second dielectric layer being bonded to said first voltage plane;
a plurality of second vias extending from said second conductive layer to a second plurality of said leads, said second vias including a second layer of conductive material extending over said second conductive layer;

said second conductive layer and said second conductive material extending thereover defining a second voltage plane; and said second vias and the electrically conductive material of said second vias passing through an opening in said first voltage plane of larger cross section than said second vias and being surrounded by insulating material to prevent electrical contact between the conductive material in said second vias and said first voltage plane.

35. An interconnect device for electronic components as in claim 34 and comprising at least one window through said second voltage plane, said second dielectric sheet, said first voltage plane and said first dielectric sheet, said window exposing said leads;

said vias, window and frame being formed at least in part by laser etching wherein said conductive sheet forms a mask for laser etching of said via holes and said conductive layer forms a mask for laser etching of said window and frame.

36. An interconnect device for electronic components as in claim 35 including:

a second window spaced from and surrounding said first window and defining at least a first frame between said first and second windows, said second window exposing said leads.

37. An interconnect device for electronic components as in claim 34 wherein:

with respect to any second via, the opening in the second conductive sheet for the second via hole is smaller in cross section then the corresponding opening for that second via in the first voltage plane, whereby a space is defined in said first voltage plane surrounding and spacing the second via from the first voltage plane where the second via passes between the first voltage plane, said space being filled with an insulating material.

38. An interconnect device for electronic components as in claim 34 including:

decoupling capacitor means connected between said first voltage plane and said second voltage plane.

39. An interconnect device for electronic components as in claim 34 including:

decoupling capacitor means connected between said first voltage plane and said second voltage plane;

a first plate of said decoupling capacitor means being connected to said first voltage plane by a first via connected from said first voltage plane to one of said leads and a second via connected from said second plate to said one lead.

40. An interconnect device as in claim 39 wherein:

said second plate and said second via are each connected to a portion of said second voltage plane which is electrically isolated from the remainder of said second voltage plane.

* * * * *